US012230051B2

(12) United States Patent
Lee et al.

(10) Patent No.: US 12,230,051 B2
(45) Date of Patent: Feb. 18, 2025

(54) DISPLAY DEVICE

(71) Applicant: SAMSUNG DISPLAY CO., LTD., Yongin-si (KR)

(72) Inventors: Kyunghoe Lee, Yongin-si (KR); Cheol-Gon Lee, Yongin-si (KR); Mukyung Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/506,063

(22) Filed: Nov. 9, 2023

(65) Prior Publication Data
US 2024/0249551 A1    Jul. 25, 2024

(30) Foreign Application Priority Data

Jan. 19, 2023    (KR) ........................ 10-2023-0007695

(51) Int. Cl.
*G06V 40/13*     (2022.01)
*G06F 3/044*     (2006.01)
*H10K 39/34*     (2023.01)
*H10K 59/40*     (2023.01)

(52) U.S. Cl.
CPC ........ *G06V 40/1318* (2022.01); *G06F 3/0446* (2019.05); *H10K 39/34* (2023.02); *H10K 59/40* (2023.02); *G06F 2203/04107* (2013.01)

(58) Field of Classification Search
CPC .... H10K 59/40; H10K 59/126; H10K 59/122; H10K 50/865; G06F 3/0412; G06V 40/1324; G06V 40/1318; G02F 1/133512
See application file for complete search history.

(56) References Cited

U.S. PATENT DOCUMENTS

2022/0399405 A1\*   12/2022   Lee ........................ H10K 59/38

FOREIGN PATENT DOCUMENTS

CN            112269495 A   \*   1/2021   .......... G06F 3/0412

\* cited by examiner

*Primary Examiner* — Sanjiv D. Patel
(74) *Attorney, Agent, or Firm* — F. CHAU & ASSOCIATES, LLC

(57) ABSTRACT

A display panel that includes a plurality of light emitting elements and a plurality of light detection elements, and an input sensing unit disposed on the display panel. The input sensing unit includes a first detection electrode, a second detection electrode insulated from and that intersects the first detection electrode, and a plurality of light blocking parts that include detection openings that overlap the light detection elements. The light blocking parts include a plurality of first light blocking parts spaced apart from a boundary between the first detection electrode and the second detection electrode, and a plurality of second light blocking parts closer to the boundary than the first light blocking parts. Side surfaces of the second light blocking parts that face the boundary have shapes that correspond to edges of the first detection electrode and the second detection electrode adjacent to the second light blocking parts.

20 Claims, 21 Drawing Sheets

FIG. 16A
FIG. 16B
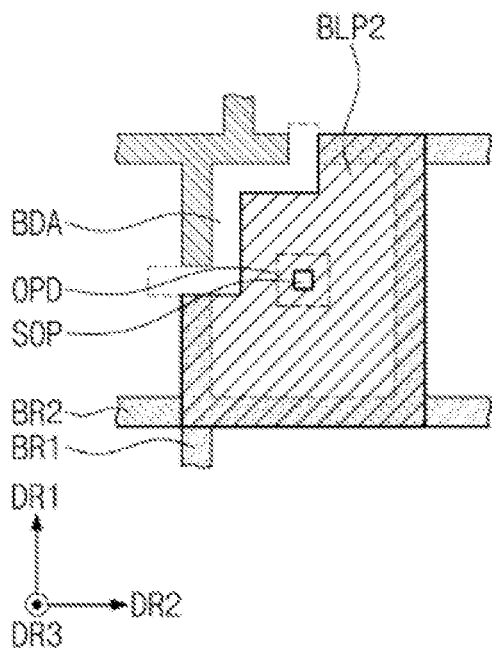
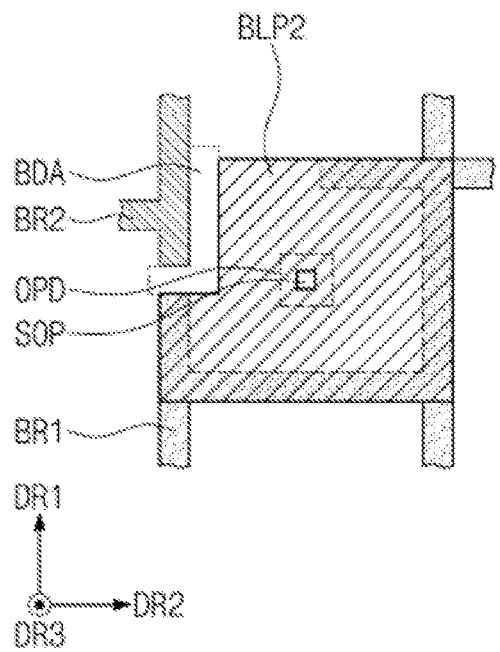
FIG. 16C
FIG. 16D
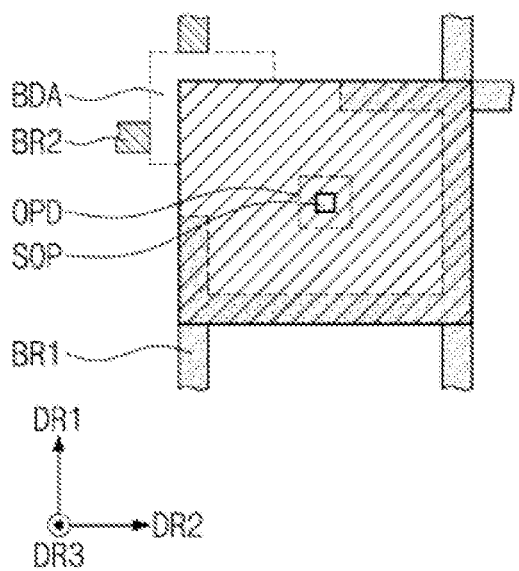
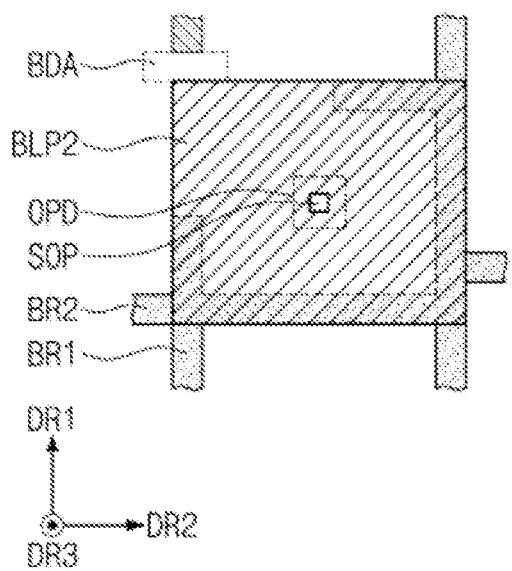

DISPLAY DEVICE

CROSS-REFERENCE TO RELATED APPLICATIONS

This application claims priority under 35 U.S.C. § 119 from Korean Patent Application No. 10-2023-0007695, filed on Jan. 19, 2023 in the Korean Intellectual Property Office, the contents of which are herein incorporated by reference in their entirety.

TECHNICAL FIELD

Embodiments of the present disclosure described herein are directed to a display device.

DISCUSSION OF THE RELATED ART

Electronic devices, such as smart phones, digital cameras, laptop computers, navigation devices, and smart televisions that provide images to users include display devices for displaying images. These display devices generate images and provide the images to the users through display screens.

A current display device typically includes a display panel that generates an image, an input sensing unit that is disposed on the display panel and senses an external input, and a fingerprint sensor disposed inside the display panel. The input sensing unit senses a touch of the user. The fingerprint sensor senses a fingerprint of the user.

An input sensing unit includes a plurality of detection electrodes that sense an external input and connection patterns that connect the detection electrodes. When a light beam other than the fingerprint is incident to the fingerprint sensor, a fingerprint is not normally sensed. Thus, a technology is needed that blocks unnecessary light beams provided to the fingerprint sensor.

SUMMARY

Embodiments of the present disclosure provide a display device that prevents first and second detection parts from shorting each other by reducing an area of a light blocking part adjacent to a boundary between the first and second detection parts.

According to an embodiment, a display device includes a display panel that includes a plurality of light emitting elements and a plurality of light detection elements arranged between the light emitting elements, and an input sensing unit disposed on the display panel. The input sensing unit includes a first detection electrode, a second detection electrode that is insulated from and intersects the first detection electrode, and a plurality of light blocking parts that include detection openings that overlap the light detection elements when viewed in a plan view. The light blocking parts include a plurality of first light blocking parts that are spaced apart from a boundary between the first detection electrode and the second detection electrode, and a plurality of second light blocking parts that are closer to the boundary than the first light blocking parts. When viewed in a plan view, side surfaces of the second light blocking parts that face the boundary have shapes that correspond to edges of the first detection electrode and the second detection electrode adjacent to the second light blocking parts.

According to an embodiment, a display device includes a display panel that includes a plurality of light emitting elements and a plurality of light detection elements arranged between the light emitting elements, and an input sensing unit disposed on the display panel. The input sensing unit includes a plurality of first detection parts arranged in a first direction, a plurality of second detection parts that are insulated from and intersect the first detection parts, and a plurality of light blocking parts that include detection openings that overlap the light detection elements when viewed in a plan view. The light blocking parts adjacent to a boundary between the first detection parts and the second detection parts have a stepped shape.

BRIEF DESCRIPTION OF THE FIGURES

FIGS. 16A to 16D illustrate a light blocking part according to an embodiment of the present disclosure.

DETAILED DESCRIPTION

Figure 1:
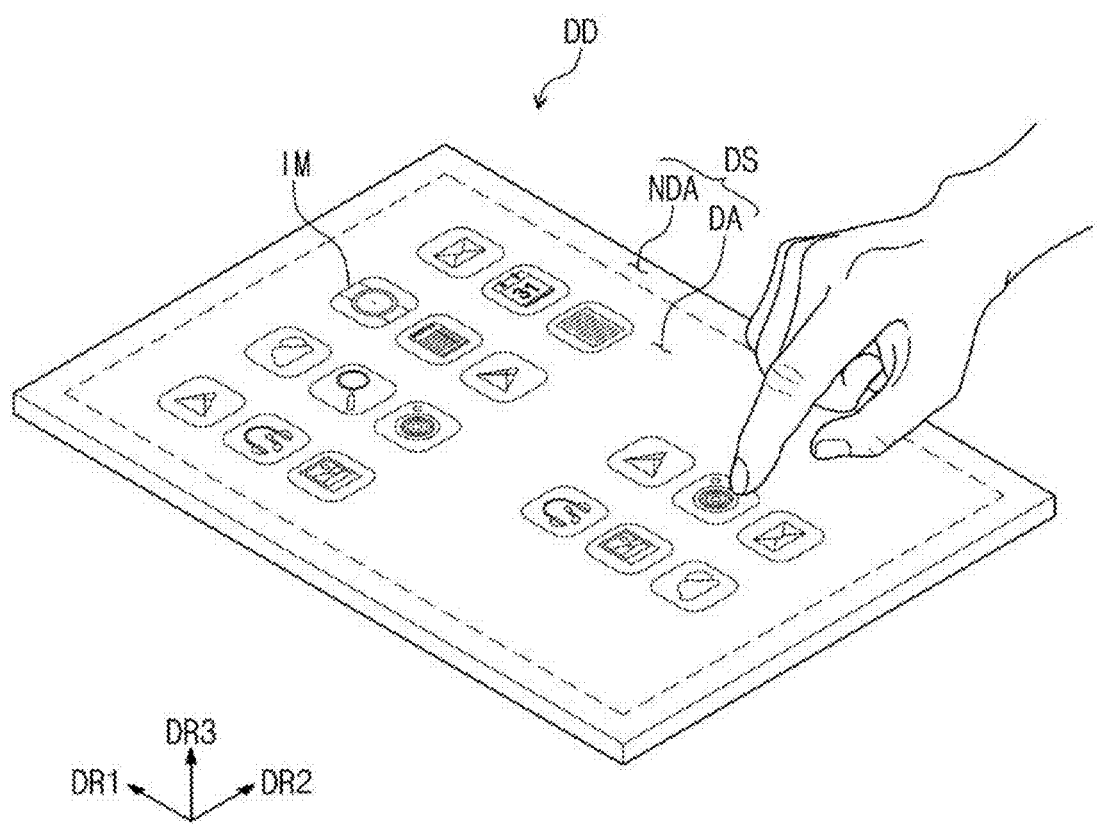
FIG. 1 is a perspective view of a display device according to an embodiment of the present disclosure.

Features of the present disclosure and a method of achieving the features will become apparent with reference to embodiments described below in detail in conjunction with the accompanying drawings. However, embodiments of the present disclosure is not limited to embodiments described below, but can be implemented in various forms, and embodiments are provided to completely inform the scope of the present disclosure to those skilled in the art to which the present disclosure belongs, and are merely defined by the scope of the appended claims. Throughout the specification, the same reference numerals may refer to the same components.

When it is mentioned that a first element or layer is disposed "on" or "above" a second element or layer, this includes both a case in which the first element or layer is directly on or above the second element or layer and a case in which a third element or layer is interposed therebetween. On other hand, when it is mentioned that the first element is disposed directly "on" or "above" the second element, this indicates that the third element or layer is not interposed therebetween. The term "and/or" includes each of mentioned items and all combinations of one or more of the mentioned items.

Hereinafter, an embodiment of the present disclosure will be described in more detail with reference to the accompanying drawings.

FIG. 1 is a perspective view of a display device according to an embodiment of the present disclosure.

Referring to FIG. 1, a display device DD according to an embodiment of the present disclosure has a rectangular shape that has long sides that extend in a first direction DR1 and short sides that extend in a second direction DR2 that intersects the first direction DR1. However, embodiments of the present disclosure are not necessarily limited thereto, and in some embodiments, the display device DD may have various other shapes such as a circular shape and polygonal shapes.

Hereinafter, a direction substantially perpendicular to a plane defined by the first direction DR1 and the second direction DR2 is defined as a third direction DR3. Further, in the present specification, the meaning "when viewed in a plan view" is defined as a state of being viewed from the third direction DR3.

An upper surface of the display device DD may be defined as a display surface DS and is a plane defined by the first direction DR1 and the second direction DR2. Images IM generated by the display device DD are provided to a user through the display surface DS.

The display surface DS includes a display area DA and a non-display area NDA around the display area DA. The display area DA displays an image, and the non-display area NDA does not display the image. The non-display area NDA surrounds the display area DA and defines an edge of the display device DD, which is printed in a predetermined color.

The display device DD can be used for large electronic devices such as televisions, monitors, or external billboards. Further, the display device DD can be used for small or medium-sized electronic devices such as a personal computers (PC), laptops, personal digital terminals, vehicle navigation systems, game consoles, smart phones, tablet PCs, or cameras. However, embodiments are not necessarily limited thereto, and in other embodiments, the display device DD can be used for other electronic devices as long as the other electronic devices do not deviate from the concept of the present disclosure.

Figure 2:
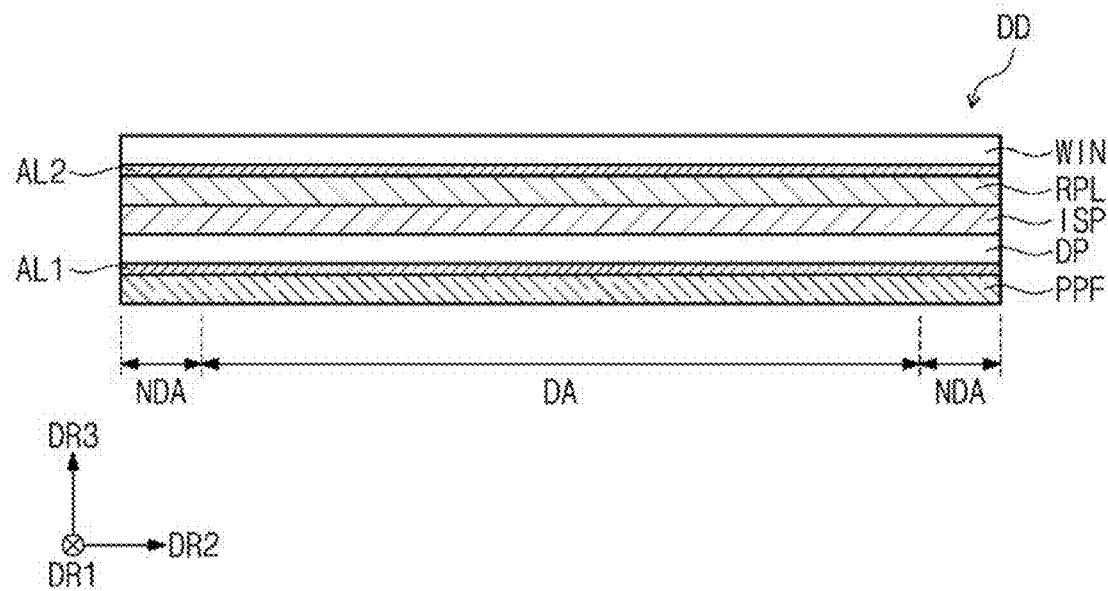
FIG. 2 is a cross sectional view of a display device illustrated in FIG. 1.

FIG. 2 is a cross sectional view of a display device illustrated in FIG. 1.

FIG. 2 is a cross-sectional view of the display device DD when viewed in the first direction DR1.

Referring to FIG. 2, in an embodiment, the display device DD includes a display panel DP, an input sensing unit ISP, a reflection prevention layer RPL, a window WIN, a panel protection film PPF, and first and second adhesive layers AL1 and AL2.

The display panel DP may be a flexible display panel. The display panel DP according to an embodiment of the present disclosure is a light emitting display panel, but embodiments of the present disclosure are not particularly limited thereto.

For example, the display panel DP may be an organic light emitting display panel or an inorganic light emitting display panel. A light emitting layer of an organic light emitting display panel includes an organic light emitting material. A light emitting layer of an inorganic light emitting display panel includes a quantum dot and/or a quantum rod. Hereinafter, the display panel DP will be described as an organic light emitting display panel.

The input sensing unit ISP is disposed on the display panel DP. The input sensing unit ISP includes a plurality of detection parts that capacitively sense an external input. The detection parts will be described in detail with reference to FIG. 9. In an embodiment, the input sensing unit ISP is directly manufactured on the display panel DP when the display device DD is manufactured. However, embodiments of the present disclosure are not necessarily limited thereto, and in some embodiments, the input sensing unit ISP is manufactured as a separate panel from the display panel DP and attached to the display panel DP by an adhesive layer.

The reflection prevention layer RPL is disposed on the input sensing unit ISP. In an embodiment, the reflection prevention layer RPL is directly manufactured on the input sensing unit ISP when the display device DD is manufactured. However, embodiments of the present disclosure are not necessarily limited thereto, and some embodiments, the reflection prevention layer RPL is manufactured as a separate panel and attached to the input sensing unit ISP by an adhesive layer.

The reflection prevention layer RPL is an external light reflection prevention film. The reflection prevention layer RPL reduces a reflectance of an external light beam from an upper side of the display device DD toward the display panel DP. The external light beam is not visually recognized by a user due to the reflection prevention layer RPL. The reflection prevention layer RPL will be described in detail with reference to FIGS. 19A and 19B.

The window WIN is disposed on the reflection prevention layer RPL. The window WIN protects the display panel DP, the input sensing unit ISP, and the reflection prevention layer RPL from external scratches and impacts.

The panel protection film PPF is disposed below the display panel DP. The panel protection film PPF protects a lower portion of the display panel DP. The panel protection film PPF includes a flexible plastic material such as polyethyleneterephthalate (PET).

The first adhesive layer AL1 is disposed between the display panel DP and the panel protection film PPF, and the display panel DP and the panel protection film PPF are adhered to each other by the first adhesive layer AL1. The second adhesive layer AL2 is disposed between the window WIN and the reflection prevention layer RPL, and the window WIN and the reflection prevention layer RPL are adhered to each other by the second adhesive layer AL2.

Figure 3:
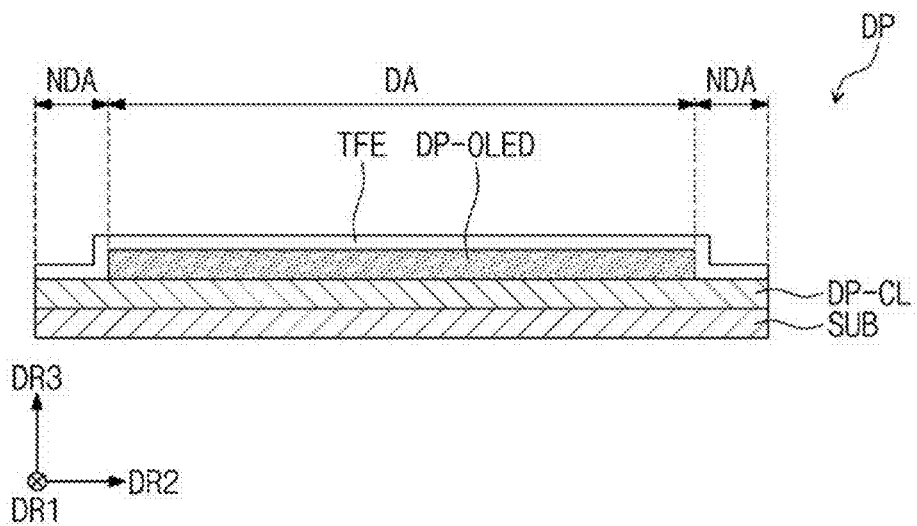
FIG. 3 is a cross sectional view of a display panel illustrated in FIG. 2.

FIG. 3 is a cross sectional view of a display panel illustrated in FIG. 2.

FIG. 3 is a cross-sectional view of the display panel DP when viewed in the first direction DR1.

Referring to FIG. 3, in an embodiment, the display panel DP includes a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB includes the display area DA and the non-display area NDA around the display area DA. The substrate SUB includes a flexible plastic material such as glass or polyimide (PI). The display element layer DP-OLED is disposed on the display area DA.

A plurality of pixels are arranged in the circuit element layer DP-CL or the display element layer DP-OLED. Each of the pixels includes a transistor disposed in the circuit element layer DP-CL and a light emitting element disposed in the display element layer DP-OLED and connected to the transistor. A configuration of the pixel will be described below in more detail.

The thin film encapsulation layer TFE is disposed on the circuit element layer DP-CL and covers the display element layer DP-OLED. The thin film encapsulation layer TFE protects the pixels from moisture, oxygen, and foreign substances.

Figure 4:
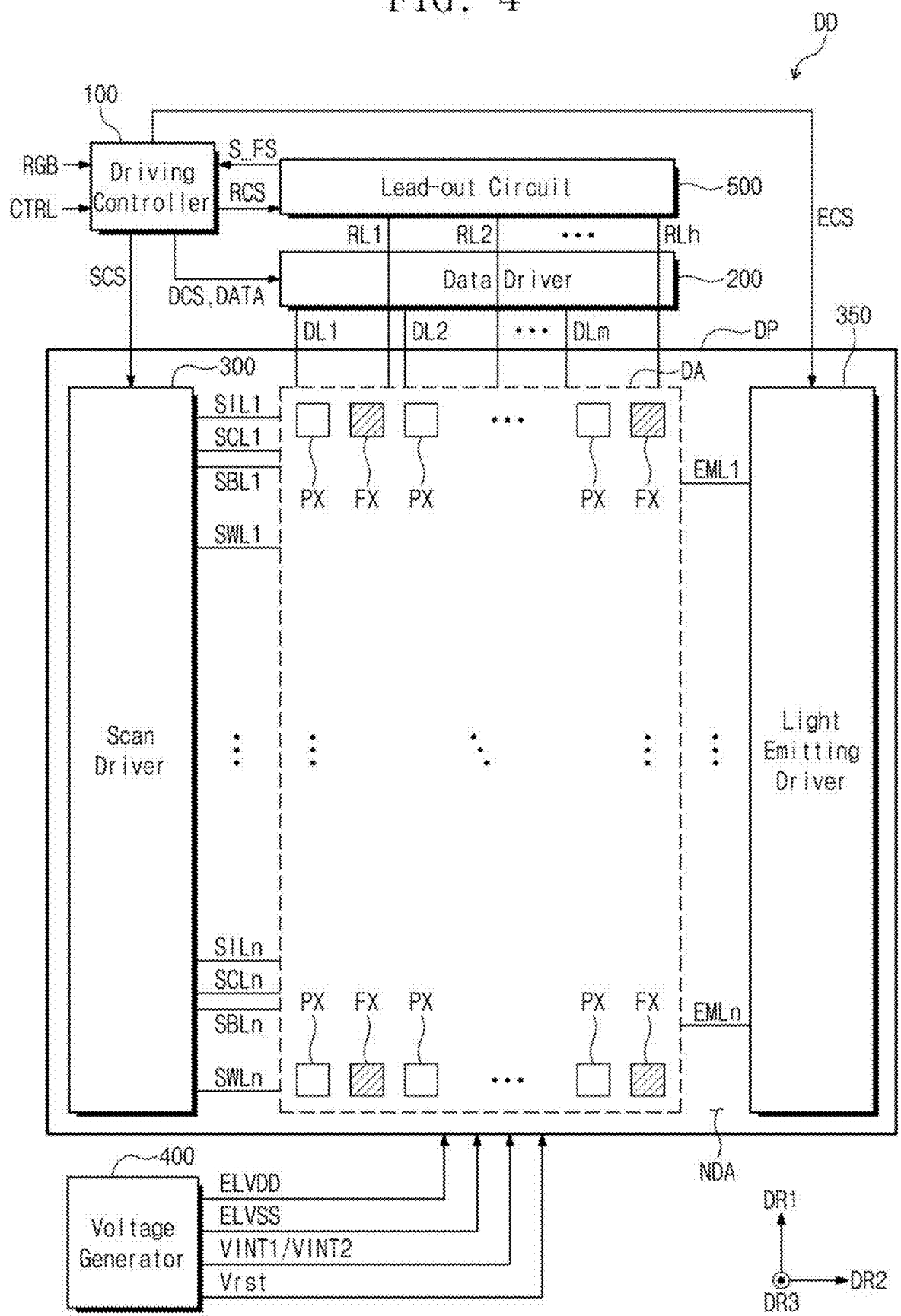
FIG. 4 is a block diagram of a display device according to an embodiment of the present disclosure.

FIG. 4 is a block diagram of a display device according to an embodiment of the present disclosure.

Referring to FIG. 4, in an embodiment, the display device DD includes the display panel DP, a driving controller 100, and a driving circuit. The driving circuit includes a data driver 200, a scan driver 300, a light emitting driver 350, a voltage generator 400, and a lead-out circuit 500. In an embodiment, the voltage generator 400 and the lead-out circuit 500 can implemented as one driving chip together with the driving controller 100.

The driving controller 100 receives an image signal RGB and a control signal CTRL. The driving controller 100 generates an image data signal DATA by converting a data format of the image signal RGB to meet an interface specification of the data driver 200. The driving controller 100 outputs a first control signal SCS, a second control signal ECS, a third control signal DCS, and a fourth control signal RCS.

The data driver 200 receives the third control signal DCS and the image data signal DATA from the driving controller 100. The data driver 200 converts the image data signal DATA into data signals and outputs the data signals to a plurality of data lines DL1 to DLm that will be described below. The data signals are analog voltages that correspond to gradation values of the image data signal DATA.

The scan driver 300 receives the first control signal SCS from the driving controller 100. The scan driver 300 outputs scan signals to scan lines in response to the first control signal SCS.

The voltage generator 400 generates voltages that operate the display panel DP. The voltage generator 400 generates a first driving voltage ELVDD, a second driving voltage ELVSS, a first initialization voltage VINT1, and a second initialization voltage VINT2.

The display panel DP includes a plurality of pixels PX arranged in the display area DA and a plurality of fingerprint sensors FX arranged in the display area DA. In an embodiment, the pixels PX and the fingerprint sensors FX are alternately arranged in the first and second directions DR1 and DR2. For example, each of the fingerprint sensors FX is disposed between two adjacent pixels PX. However, embodiments of the present disclosure are not necessarily limited thereto, and in some embodiments, two or more pixels PX are arranged between two fingerprint sensors FX that are adjacent in the first direction DR1, or two or more pixels PX are arranged between two fingerprint sensors FX that are adjacent to each other in the second direction DR2.

The display panel DP further includes initialization scan lines SIL1 to SILn, compensation scan lines SCL1 to SCLn, writing scan lines SWL1 to SWLn, black scan lines SBL1 to SBLn, light emitting control lines EML1 to EMLn, data lines DL1 to DLm, and lead-out lines RL1 to RLh. The initialization scan lines SIL1 to SILn, the compensation scan lines SCL1 to SCLn, the writing scan lines SWL1 to SWLn, the black scan lines SBL1 to SBLn, and the light emitting control lines EML1 to EMLn extend in the second direction DR2. The initialization scan lines SIL1 to SILn, the compensation scan lines SCL1 to SCLn, the writing scan lines SWL1 to SWLn, the black scan lines SBL1 to SBLn, and the light emitting control lines EML1 to EMLn are spaced apart from each other in the first direction DR1. The data lines DL1 to DLm and the lead-out lines RL1 to RLh extend in the first direction DR1 and are spaced apart in the second direction DR2.

The plurality of pixels PX are electrically connected to the initialization scan lines SIL1 to SILn, the compensation scan lines SCL1 to SCLn, the writing scan lines SWL1 to SWLn, the black scan lines SBL1 to SBLn, the light emitting control lines EML1 to EMLn, and the data lines DL1 to DLm. Each of the plurality of pixels PX is electrically connected to four scan lines.

The fingerprint sensors FX are electrically connected to the writing scan lines SWL1 to SWLn and the lead-out lines RL1 to RLh. In an embodiment, each of the fingerprint sensors FX is electrically connected to one scan line. However, embodiments of the present disclosure are not necessarily limited thereto, and in some embodiments, the number of scan lines connected to each of the fingerprint sensors FX varies.

The scan driver 300 is disposed in the non-display area NDA of the display panel DP. The scan driver 300 receives the first control signal SCS from the driving controller 100. The scan driver 300 outputs initialization scan signals to the initialization scan lines SIL1 to SILn and compensation scan signals to the compensation scan lines SCL1 to SCLn in response to the first control signal SCS. Further, the scan driver 300 outputs writing scan signals to the writing scan lines SWL1 to SWLn and black scan signals to the black scan lines SBL1 to SBLn in response to the first control signal SCS. In addition, the scan driver 300 may include first and second scan drivers. The first scan driver outputs the initialization scan signals and the compensation scan signals, and the second scan driver outputs the writing scan signals and the black scan signals.

The light emitting driver 350 is disposed in the non-display area NDA of the display panel DP. The light emitting driver 350 receives the second control signal ECS from the driving controller 100. The light emitting driver 350 outputs light emitting control signals to the light emitting control lines EML1 to EMLn in response to the second control signal ECS. In addition, the scan driver 300 is connected to the light emitting control lines EML1 to EMLn. For example, in an embodiment, the light emitting driver 350 is omitted, and the scan driver 300 outputs the light emitting control signals to the light emitting control lines EML1 to EMLn.

The lead-out circuit 500 receives the fourth control signal RCS from the driving controller 100. The lead-out circuit 500 receives detection signals from the lead-out lines RL1 to RLh in response to the fourth control signal RCS. The lead-out circuit 500 processes the detection signals received from the lead-out lines RL1 to RLh and provides processed detection signals S_FS to the driving controller 100. The driving controller 100 recognizes biometric information on the basis of the detection signals S_FS.

Figure 5:
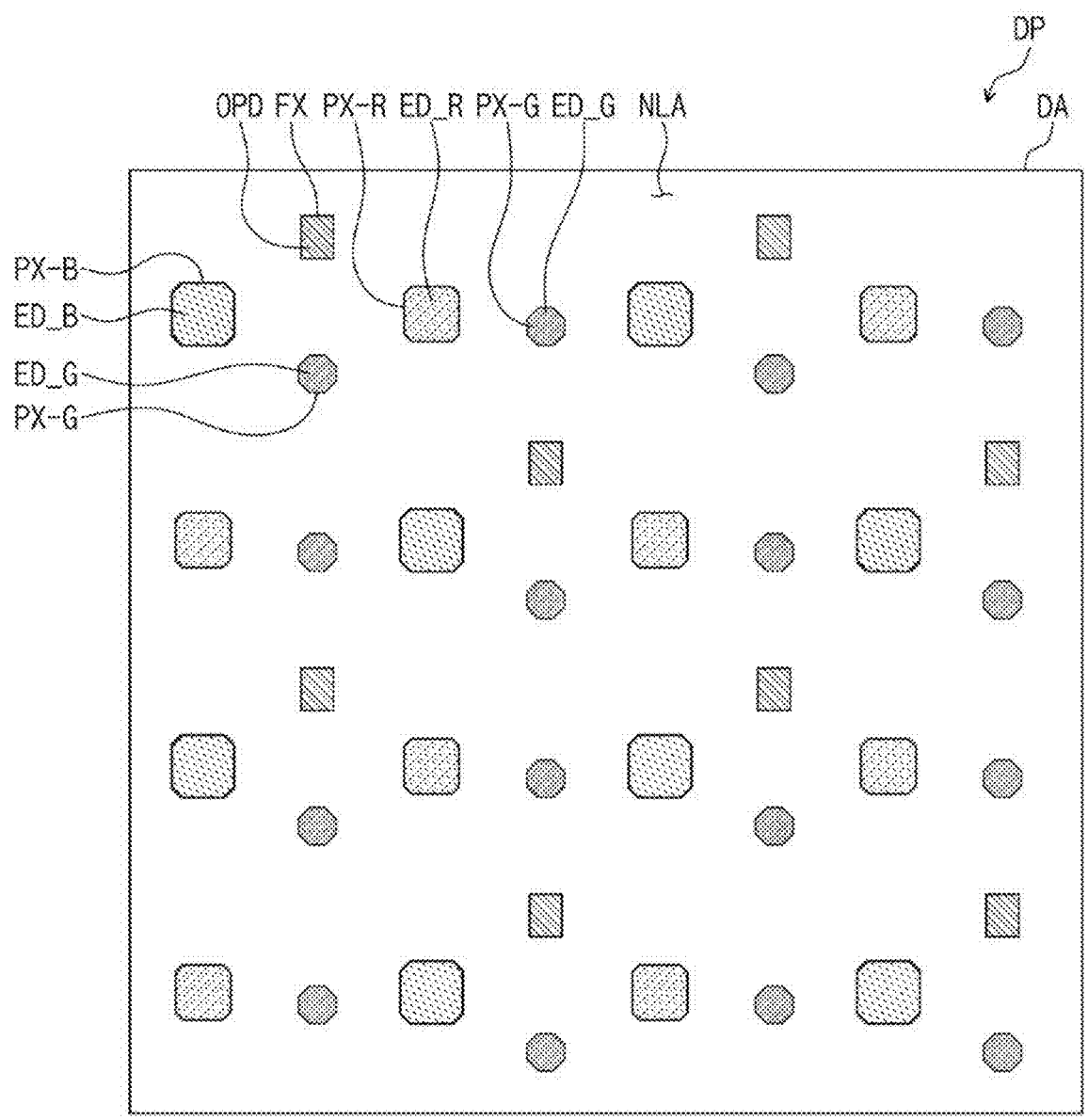
FIG. 5 is an enlarged plan view of a partial area of a display area illustrated in FIG. 4.

FIG. 5 is an enlarged plan view of a partial area of a display area illustrated in FIG. 4.

Referring to FIG. 5, in an embodiment, in the display panel DP, each of first pixels PX-R includes a first light emitting element ED_R. Each of second pixels PX_G includes a second light emitting element ED_G. Each of third pixels PX_B includes a third light emitting element ED_B. Each of the fingerprint sensors FX includes a light detection element OPD. A non-light emitting area NLA is an area in which the first, second, and third light emitting elements ED_R, ED_G, and ED_B and the light detection elements OPD are not arranged. The first light emitting element ED_R emits red light, the second light emitting element ED_G emits green light and the third light emitting element ED_B emits blue light.

The first light emitting elements ED_R and the third light emitting elements ED_B are alternately arranged in the first direction DR1. The first light emitting elements ED_R and the third light emitting elements ED_B are alternately arrayed in the second direction DR2. A column of the light detection elements OPD and the second light emitting elements ED_G that extends in the first direction DR1 is arranged between columns of the first light emitting elements ED_R and the third light emitting elements ED_B that are adjacent to each other in the first direction DR1.

Two second light emitting elements ED_G are arranged between the light detection elements OPD adjacent to each other in the first direction DR1. The second light emitting elements ED_G and the light detection elements OPD form a column that extends in the first direction DR1.

The first light emitting elements ED_R and the third light emitting elements ED_B are alternately arranged. The first direction DR1 corresponds to a column, and the second direction DR2 corresponds to a row. Referring to FIG. 5, except for the light detection elements OPD and the second light emitting elements ED_G, the first light emitting elements ED_R and the third light emitting elements ED_B are alternately arranged in each row, and the first light emitting elements ED_R and the third light emitting elements ED_B are alternately arranged in each column.

Hereinafter, a configuration of one first light emitting element ED_R, one second light emitting element ED_G, one third light emitting element ED_B, and one light detection element OPD will be described.

An area of the third light emitting element ED_B is greater than those of the first light emitting element ED_R and the second light emitting element ED_G. Further, an area of the second light emitting element ED_G is less than those of the first light emitting element ED_R and the third light emitting element ED_B. The first light emitting element ED_R is smaller than the third light emitting element ED_B and larger than the second light emitting element ED_G.

Figure 6:
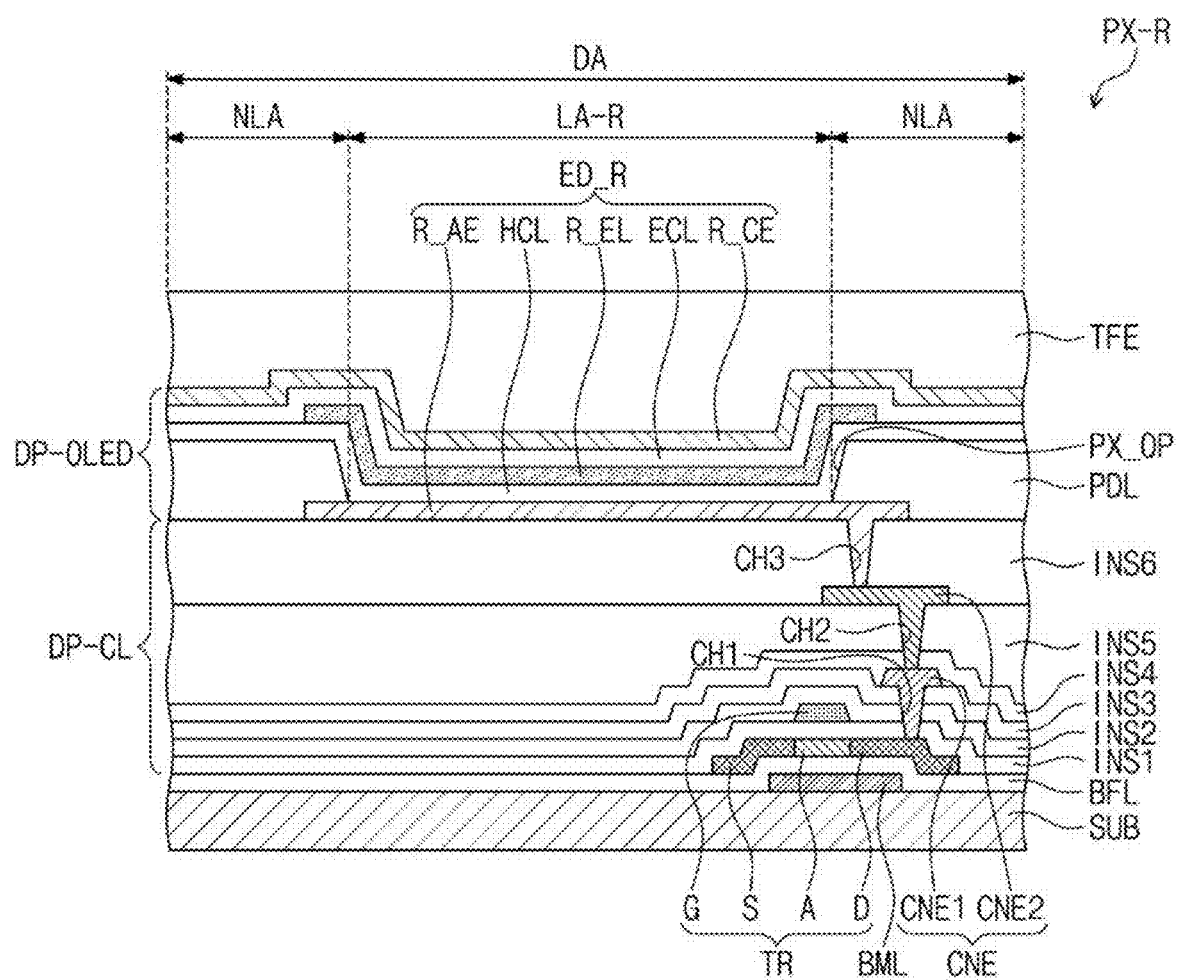
FIG. 6 is a cross sectional view of a pixel of a display panel illustrated in FIG. 5.

FIG. 6 is a cross sectional view of one pixel of a display panel illustrated in FIG. 5.

FIG. 6 is a cross-sectional view of the first pixel PX-R. Hereinafter, the first pixel PX-R will be described, but the second pixel PX-G and the third pixel PX-B also include substantially the same configuration as the first pixel PX-R.

Referring to FIG. 6, in an embodiment, the first pixel PX-R may include a transistor TR and the first light emitting element ED_R. The first light emitting element ED_R includes a first electrode R_AE (or an anode), a second electrode R_CE (or a cathode), a hole control layer HCL, an electron control layer ECL, and a light emitting layer R_EL.

The transistor TR and the first light emitting element ED_R are disposed on the substrate SUB. One transistor TR is illustrated. However, the first pixel PX-R may include a plurality of transistors TR and at least one capacitor that drive the first light emitting element ED_R.

The display area DA includes a light emitting area LA-R that corresponds to the first pixel PX-R and the non-light emitting area NLA around the light emitting area LA-R. The light emitting area LA-R is an area in which the first electrode R_AE is exposed by a pixel opening PX_OP of a pixel definition layer PDL. The first light emitting element ED_R is disposed in the light emitting area LA-R.

A dummy pattern BML that includes a conductive material is disposed on the substrate SUB. When viewed in a plan view, the dummy pattern BML overlaps the transistor TR. A buffer layer BFL is disposed on the substrate SUB, and the buffer layer BFL is an inorganic layer. The buffer layer BFL covers the dummy pattern BML. A semiconductor pattern is disposed on the buffer layer BFL. The semiconductor pattern includes at least one of polysilicon, amorphous silicon, or a metal oxide.

The semiconductor pattern may be doped with an N-type dopant or a P-type dopant. The semiconductor pattern includes a high-doped area and a low-doped area. Conductivity of the high-doped area is higher than that of the low-doped area and substantially serves as a source electrode and a drain electrode of the transistor TR. The low-doped area substantially corresponds to an active area (or a channel) of a transistor.

A source area "S," an active area "A," and a drain area "D" of the transistor TR are formed from the semiconductor pattern. A first insulating layer INS1 is disposed on the semiconductor pattern and the buffer layer BFL. A gate "G" of the transistor TR is disposed on the first insulating layer INS1. A second insulating layer INS2 may be disposed on the gate "G" and the first insulating layer INS1. A third insulating layer INS3 is disposed on the second insulating layer INS2.

A connection electrode CNE includes a first connection electrode CNE1 and a second connection electrode CNE2 to connect the transistor TR and the red light emitting element ED_R. The first connection electrode CNE1 is disposed on the third insulating layer INS3 and is connected to the drain area "D" through a first contact hole CH1 formed through the first to third insulating layers INS1 to INS3.

A fourth insulating layer INS4 is disposed on the first connection electrode CNE1 and the third insulating layer INS3. A fifth insulating layer INS5 is disposed on the fourth insulating layer INS4. The second connection electrode CNE2 is disposed on the fifth insulating layer INS5. The second connection electrode CNE2 is connected to the first connection electrode CNE1 through a second contact hole CH2 formed through the fourth and fifth insulating layers INS4 and INS5.

A sixth insulating layer INS6 is disposed on the second connection electrode CNE2 and the fifth insulating layer INS5. Layers from the buffer layer BFL to the sixth insulating layer INS6 may be defined as the circuit element layer DP-CL. Each of the first insulating layer INS1 to the sixth insulating layer INS6 may be an inorganic layer or organic layer.

The first electrode R_AE is disposed on the sixth insulating layer INS6. The first electrode R_AE is connected to the second connection electrode CNE2 through a third contact hole CH3 formed through the sixth insulating layer INS6. The pixel defining layer PDL in which the pixel opening PX_OP that exposes a predetermined portion of the first electrode R_AE is formed is disposed on the first electrode R_AE and the sixth insulating layer INS6.

The hole control layer HCL is disposed on the first electrode R_AE and the pixel defining layer PDL. The hole control layer HCL includes a hole transport layer and a hole injection layer.

The light emitting layer R_EL is disposed on the hole control layer HCL. The light emitting layer R_EL is disposed in an area that corresponds to the pixel opening PX_OP. The light emitting layer R_EL may include an organic material and/or an inorganic material. The light emitting layer R_EL of FIG. 6 generates red light.

The electron control layer ECL is disposed on the light emitting layer R_EL and the hole control layer HCL. The electron control layer ECL includes an electron transport layer and an electron injection layer. The hole control layer HCL and the electron control layer ECL are commonly arranged in the light emitting area LA and the non-light emitting area NLA.

The second electrode R_CE is disposed on the electron control layer ECL. The second electrode R_CE is commonly disposed in the pixels PX_R, PX_B, and RX_G illustrated in FIG. 5. A layer in which the first light emitting element ED_R is disposed may be defined as the display element layer DP-OLED.

The thin film encapsulation layer TFE is disposed on the first light emitting element ED_R. The thin film encapsulation layer TFE includes a first inorganic layer, an organic layer, and a second inorganic layer that are sequentially laminated. The inorganic layers include inorganic materials and protect the pixels from moisture/oxygen. The organic layer includes an organic material and protects the first pixel PX-R from foreign substances such as dust particles.

Holes and electrons injected into the light emitting layer R_EL couple to each other to form excitons, and as the excitons transition to a ground state, the first light emitting element ED_R emits light.

Figure 7:
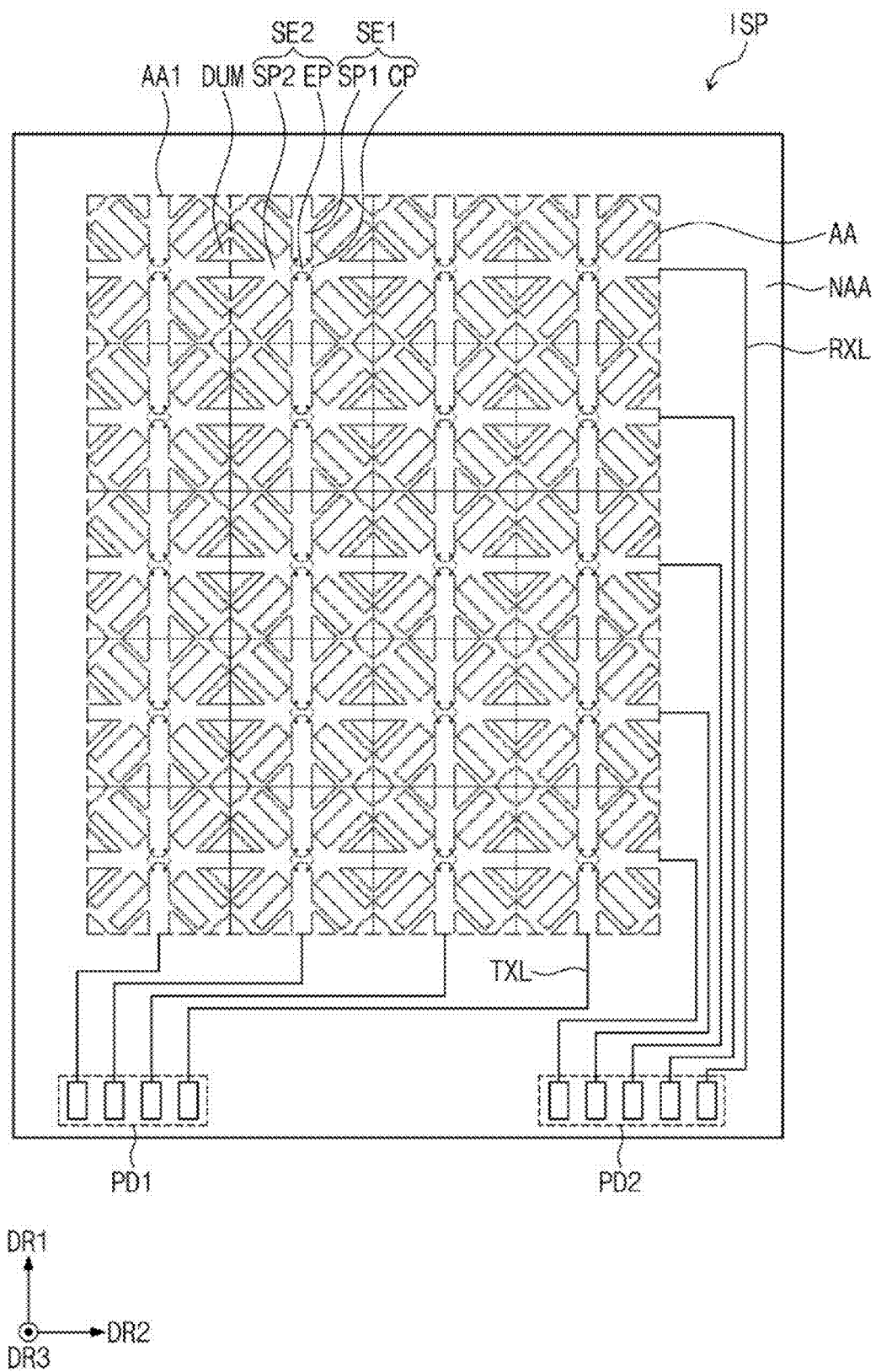
FIG. 7 is a plan view of an input sensing unit illustrated in FIG. 2.
Figure 8:
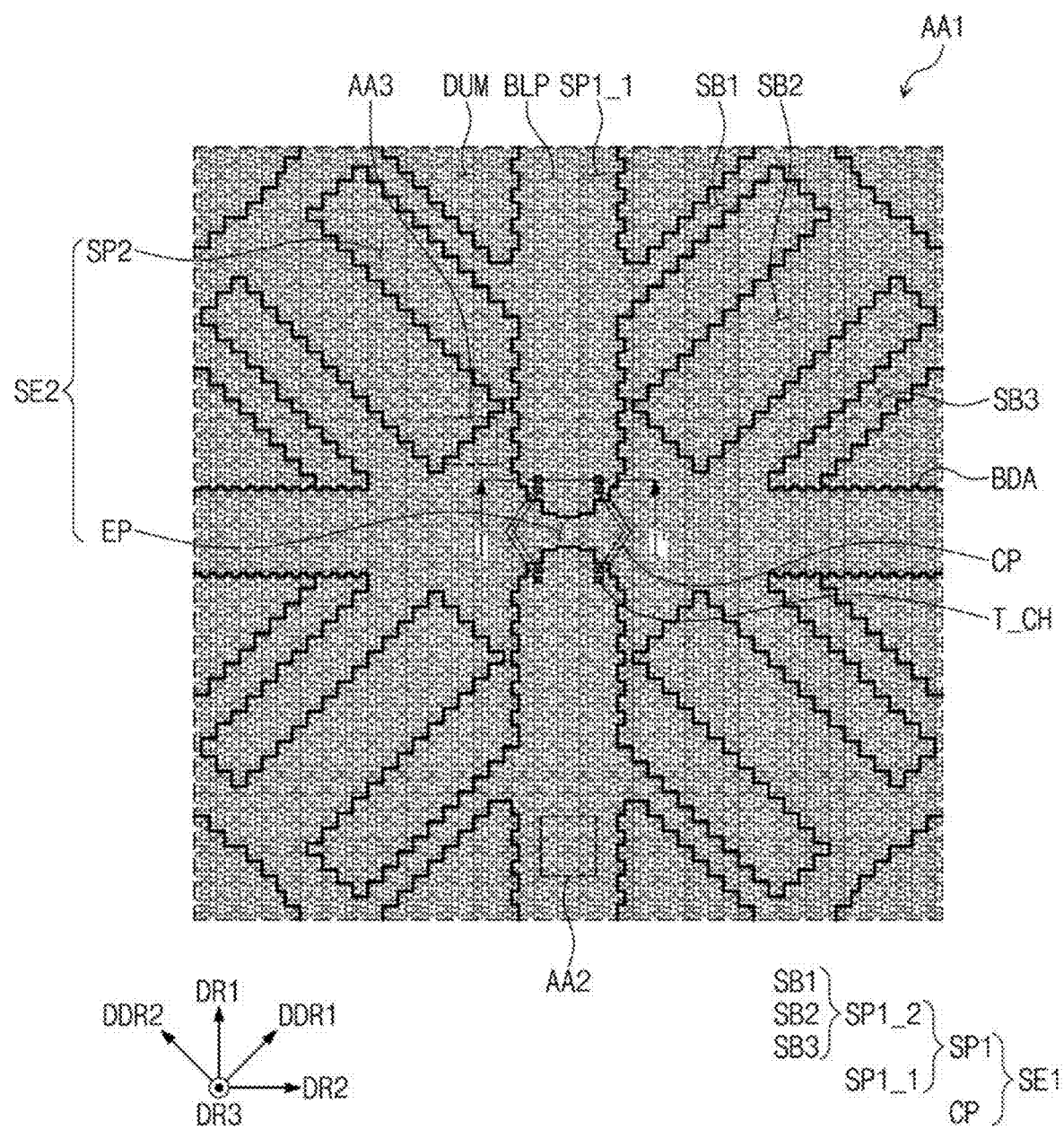
FIG. 8 is an enlarged plan view of a first area AA1 in FIG. 7.

FIG. 7 is a plan view of an input sensing unit illustrated in FIG. 2. FIG. 8 is an enlarged plan view of a first area AA1 of in FIG. 7.

In the figures, connection parts CP are illustrated as dotted lines.

In FIG. 8, boundary parts BDA are illustrated as solid lines.

Referring to FIGS. 7 and 8, in an embodiment, the input sensing unit ISP includes light blocking parts BLP, a plurality of detection electrodes SE1 and SE2, a plurality of wiring lines TXL and RXL, a dummy part DUM, and a plurality of first and second pads PD1 and PD2. The detection electrodes SE1 and SE2, the wiring lines TXL and RXL, and the first and second pads PD1 and PD2 are disposed on the thin film encapsulation layer TFE of the display panel DP illustrated in FIG. 6.

When viewed in a plan view, the input sensing unit ISP includes an active area AA and a non-active area NAA around the active area AA. The active area AA overlaps the display area DA in FIG. 3, and the non-active area NAA overlaps the non-display area NDA in FIG. 3.

The wiring lines TXL and RXL are connected to ends of the detection electrodes SE1 and SE2, extend to the non-active area NAA, and are connected to the first and second pads PD1 and PD2. In addition, a touch controller that controls the input sensing unit ISP is connected to the first and second pads PD1 and PD2 through a printed circuit board.

When viewed in a plan view, the first signal wiring lines TXL may be arranged on the non-active area NAA adjacent to a lower side of the active area AA. When viewed in a plan view, the second signal wiring lines RXL are arranged on the non-active area NAA adjacent to a right side of the active area AA.

The first detection electrodes SE1 are insulated from and extend across the second detection electrodes SE2. The dummy part DUM is insulated from the first detection electrodes SE1 and the second detection electrodes SE2 and surrounds the first detection electrodes SE1 and the second detection electrodes SE2. The boundary parts BDA are arranged between the first detection electrode SE1, the second detection electrode SE2, and the dummy part DUM.

The first detection electrodes SE1 each include a first detection part SP1 and a connection part CP. Adjacent first detection parts SP1 are arranged in the first direction DR1. The first detection parts SP1 each include a body portion SP1_1 and protrusion portions SP1_2. The body portions SP1_1 extend in the first direction DR1. Adjacent body portions SP1_1 are arranged in the second direction DR2.

The protrusion portions SP1_2 extend from the body portion SP1_1. The protrusion portions SP1_2 extend from the body portion SP1_1 in a first diagonal direction DDR1 and a second diagonal direction DDR2. The first diagonal direction DDR1 intersects the first and second directions DR1 and DR2 on a plane defined by the first direction DR1 and the second direction DR2. The second diagonal direction DDR2 intersects the first diagonal direction DDR1.

Referring to FIG. 8, in an embodiment, when viewed in a plan view, each of the protrusion portions SP1_2 include a first protrusion portion SB1, a second protrusion portion SB2, and a third protrusion portion SB3. The first protrusion portion SB1 disposed on a right side of the body portion SP1_1 extends from the body portion SP1_1 in the first diagonal direction DDR1 and the second diagonal direction DDR2, and the second protrusion portion SB2 and the third protrusion portion SB3 extend from the first protrusion portion SB1 in the first diagonal direction DDR1 and becomes adjacent to the body portion SP1_1. The second protrusion portion SB2 and the third protrusion portion SB3 are spaced apart from each other in the second diagonal direction DDR2.

The first protrusion portion SB1 of the protrusion portion SP1_2 disposed on a left side of the body portion SP1_1 extends from the body portion SP1_1 in the second diagonal direction DDR2 and the first diagonal direction DDR1, and the second protrusion portion SB2 and the third protrusion portion SB3 extend from the first protrusion portion SB1 in the second diagonal direction DDR2 and become adjacent to the body portion SP1_1. The second protrusion portion SB2 and the third protrusion portion SB3 are spaced apart from each other in the first diagonal direction DDR1.

When viewed in a plan view, the connection parts CP are arranged below the first detection parts SP1. The connection parts CP may overlap the first detection parts SP1. The connection parts CP extend in the first diagonal direction DDR1 and the second diagonal direction DDR2. The connection parts CP are arranged between the first detection parts SP1 and connect the first detection parts SP1 adjacent to each other in the first direction DR1. The first detection parts SP1 adjacent to each other in the first direction DR1 are connected to the connection parts CP through contact holes T-CH. A connection relationship between the first detection parts SP1 and the connection parts CP will be described in detail with reference to FIG. 9.

The second detection electrodes SE2 each include a second detection part SP2 and an extension pattern EP. Adjacent second detection parts SP2 are arranged in the second direction DR2. The second detection parts SP2 are arranged between the first protrusion portion SB1, the second protrusion portion SB2, and the third protrusion portion SB3. The second detection parts SP2 are spaced apart from the first detection parts SP1 without overlapping the first detection parts SP1 and are alternately arranged. The second detection parts SP2 are spaced apart from and insulated from the first detection parts SP1. The input sensing unit ISP acquires information on an external input through a change in a mutual capacitance between the first detection parts SP1 and the second detection parts SP2.

The extension pattern EP is disposed between the second detection parts SP2 adjacent to each other in the second direction DR2. The extension pattern EP extends from the second detection parts SP2. The extension pattern EP extends in the second direction DR2 and crosses the connection part CP. The extension pattern EP electrically connects the second detection parts SP2 adjacent to each other in the second direction DR2. The extension pattern EP is disposed on the same layer as the second detection parts SP2. The extension pattern EP is disposed on a different layer from the connection part CP. A detailed description thereof will be provided with reference to FIG. 9.

The dummy part DUM surrounds the first and second detection parts SP1 and SP2. The dummy part DUM is spaced apart from the first and second detection parts SP1 and SP2. The dummy part DUM is not electrically connected to the first and second detection parts SP1 and SP2. The dummy part DUM is insulated from the first and second detection parts SP1 and SP2.

Due to where the dummy part DUM is disposed, a difference in a transmittance or reflectance between a portion where the first and second detection parts SP1 and SP2 are arranged and a portion where the first and second detection parts SP1 and SP2 are not arranged decreases. Accordingly, a phenomenon in which boundaries between the first and second detection parts SP1 and SP2 are visually recognized can be prevented. Further, a phenomenon in which a boundary between the portion in which the first and second detection parts SP1 and SP2 are arranged and the portion in which the first and second detection parts SP1 and SP2 are not arranged is visually recognized can be prevented.

The dummy part DUM is formed through the same process as the first and second detection parts SP1 and SP2. Thus, the dummy part DUM includes the same material as the first detection parts SP1 and the second detection parts SP2 and has the same laminated structure as the first detection parts SP1 and the second detection parts SP2.

The light blocking parts BLP are disposed on the first detection parts SP1 and the second detection parts SP2. The light blocking parts BLP overlap the first detection parts SP1 and the second detection parts SP2. The light blocking parts BLP will be described in detail with reference to FIG. 10.

Figure 9:
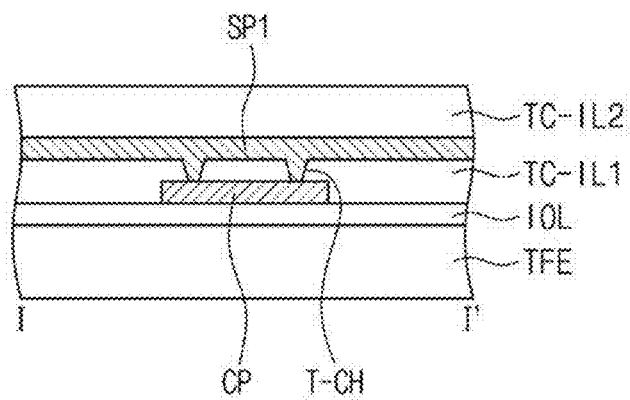
FIG. 9 is a cross-sectional view taken along line I-I' in FIG. 8.

FIG. 9 is a cross-sectional view taken along line I-I' in FIG. 8.

In FIG. 9, for simplicity of illustration, the thin film encapsulation layer TFE is illustrated as a single layer.

Referring to FIG. 9, in an embodiment, an insulating layer IOL is disposed on the thin film encapsulation layer TFE. The insulating layer IOL includes an inorganic insulating layer. The connection part CP is disposed on the insulating layer IOL. A first insulating layer TC-IL1 is disposed on the insulating layer IOL and the connection part CP. The first insulating layer TC-IL1 covers the insulating layer IOL and the connection part CP. The first insulating layer TC-IL1 may include an inorganic insulating layer or an organic insulating layer.

The first detection part SP1 is disposed on the first insulating layer TC-IL1. In addition, the second detection part SP2 and the extension pattern EP, which are arranged on the same layer as the first detection part SP1, are disposed on the first insulating layer TC-IL1. The connection part CP is connected to the first detection part SP1 through a plurality of contact holes T-CH formed in the first insulating layer TC-IL1.

A second insulating layer TC-IL2 is disposed on the first detection part SP1 and the first insulating layer TC-IL1. The second insulating layer TC-IL2 covers the first detection part SP1. The second insulating layer TC-IL2 includes an organic insulating layer.

Figure 10:
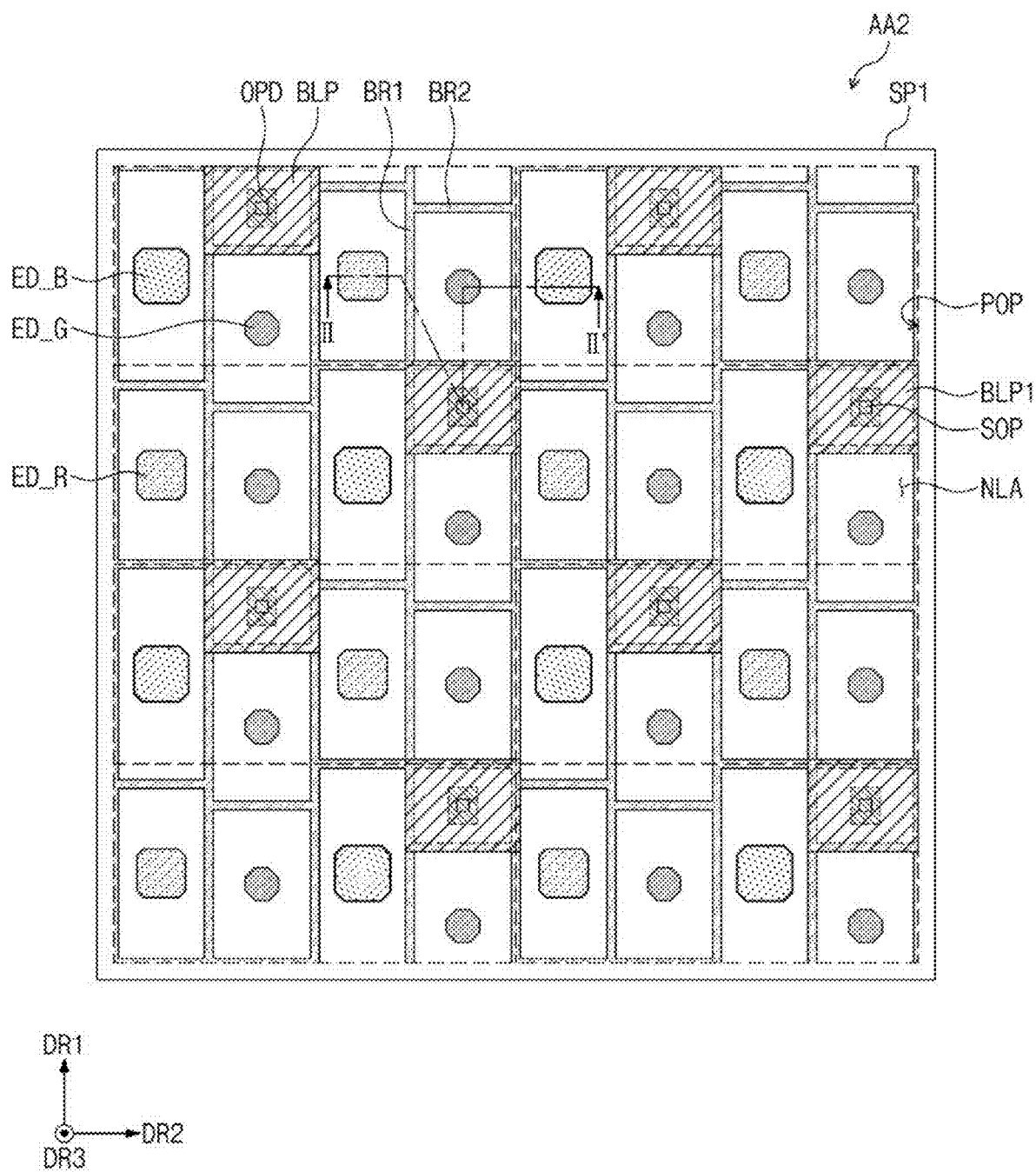
FIG. 10 is an enlarged plan view of a second area AA2 in FIG. 8.
Figure 11:
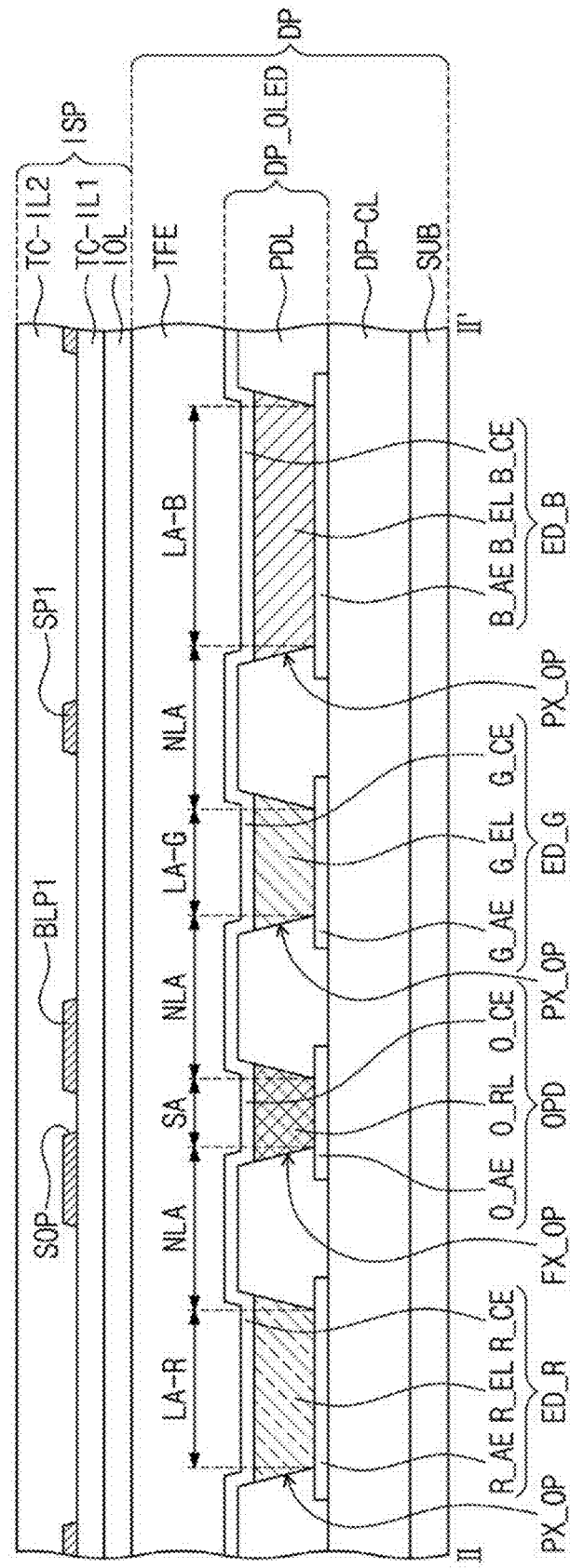
FIG. 11 is a cross-sectional view taken along line II-II' in FIG. 10.

FIG. 10 is an enlarged plan view of a second area AA2 in FIG. 8. FIG. 11 is a cross-sectional view taken along line II-II' in FIG. 10.

Since the first light emitting elements ED_R, the second light emitting elements ED_G, the third light emitting elements ED_B, and the light detection elements OPD of FIGS. 10 and 11 are the same as the first light emitting elements ED_R, the second light emitting elements ED_G, the third light emitting elements ED_B, and the light detection elements OPD of FIG. 5, a repeated description thereof will be omitted or simplified.

FIG. 10 is an enlarged plan view of the first detection part SP1. Further, FIG. 10, for example, illustrates the first detection part SP1, but the second detection part SP2 and the dummy part DUM also include substantially the same configuration as the first detection part SP1.

For simplicity of illustration, the circuit element layer DP-CL of FIG. 11 is shown as a single layer. Similarly, the hole control layer HCL and the electron control layer ECL of FIG. 6 are omitted, and light emitting layers R_EL, B_EL, and G1_EL are shown in simplified form.

Since the substrate SUB, the circuit element layer DP-CL, the display element layer DP-OLED, the thin film encapsulation layer TFE, and the first detection part SP1 of FIG. 11 are the same as the substrate SUB, the circuit element layer DP-CL, the display element layer DP-OLED, the thin film encapsulation layer TFE, and the first detection part SP1 of FIGS. 6 and 8, a repeated description thereof will be omitted or simplified.

Referring to FIGS. 10 and 11, in an embodiment, the first detection part SP1 includes branch portions BR1 and BR2 that from a mesh shape. For example, the first detection part SP1 includes, to form a mesh shape, first branch portions BR1 that extend in the first direction DR1 and second branch portions BR2 that extend in the second direction DR2 and intersect the first branch portions BR1. The first branch portions BR1 and the second branch portions BR2 are integrally formed. Pixel openings POP are formed by the first branch portions BR1 and the second branch portions BR2. When viewed in a plan view, shapes of the pixel openings POP are rectangular. However, embodiments of the present disclosure are not necessarily limited thereto, and in some embodiments, the pixel openings POP have other shapes. The shapes of the pixel openings POP will be described in detail with reference to FIGS. 19A and 19B.

The light blocking parts BLP extend from the first branch portions BR1 and the second branch portions BR2. The light blocking parts BLP are integrally formed with the first branch portions BR1 and the second branch portions BR2. For example, the light blocking parts BLP are formed on the same layer as that of first branch portions BR1 and the second branch portions BR2.

When viewed in a plan view, the first light emitting elements ED_R, the second light emitting element ED_G, and the third light emitting elements ED_B are arranged in the pixel openings POP. The first light emitting elements ED_R, the second light emitting elements ED_G, and the third light emitting elements ED_B are arranged in corresponding pixel openings POP.

When viewed in a plan view, the first detection part SP1 does not overlap the first light emitting elements ED_R, the second light emitting elements ED_G, and the third light emitting elements ED_B. When viewed in a plan view, the first detection part SP1 is arranged between the first light emitting elements ED_R, the second light emitting elements ED_G, and the third light emitting elements ED_B and extends in the first direction DR1 and the second direction DR2.

When viewed in a plan view, the first branch portions BR1 and the second branch portions BR2 pass between the first light emitting elements ED_R, the second light emitting elements ED_G, and the third light emitting elements ED_B and extend in the first direction DR1 and the second direction DR2. When viewed in a plan view, the first branch portions BR1 and the second branch portions BR2 do not overlap the first light emitting elements ED_R, the second light emitting elements ED_G, and the third light emitting elements ED_B.

According to the above structure, the first detection part SP1 is disposed on the non-light emitting area NLA. Since the pixel defining layer PDL of FIG. 7 is disposed in the non-light emitting area NLA, when viewed in a plan view, the first detection part SP1 overlaps the pixel defining layer PDL.

When viewed in a plan view, the first and second branch portions BR1 and BR2 do not overlap the first light emitting elements ED_R, the second light emitting elements ED_G, and the third light emitting elements ED_B, overlap the non-light emitting area NLA, and extend in the first direction DR1 and the second direction DR2. Since the first detection part SP1 is disposed in the non-light emitting area NLA, light generated by the first light emitting elements ED_R, the second light emitting elements ED_G, and the third light emitting elements ED_B is emitted without being affected by the first and second detection parts SP1 and SP2.

The light blocking parts BLP extend from the first branch portions BR1 and the second branch portions BR2 that are adjacent to the light detection elements OPD. The light blocking parts BLP overlap the light detection elements OPD. Hereinafter, the light blocking parts BLP spaced apart from the boundary parts BDA of FIG. 8 may be defined as first light blocking parts BLP1. The first light blocking parts BLP1 have an area greater than that of the light detection elements OPD.

When viewed in a plan view, detection openings SOP are formed at a center of the first light blocking parts BLP1. The detection openings SOP overlap the light detection elements OPD. When viewed in a plan view, each of the detection openings SOP overlaps a center of the corresponding light detection element OPD. When viewed in a plan view, an area of the detection openings SOP is less than the area of the light detection elements OPD. The detection openings SOP adjust the amount of light reflected by a fingerprint of the user and incident to the light detection elements OPD. The reflected light includes information on the user's fingerprint. Light other than the light that includes the fingerprint information can cause interference when the user's fingerprint information is received. However, since the detection openings SOP are formed in the first light blocking parts BLP1, the detection openings SOP reduce interference and thus accurately obtain the user's fingerprint information. A detailed description thereof will be provided with reference to FIGS. 18A and 18B.

Referring to FIGS. 10 and 11, in an embodiment, a photoelectric conversion layer O_RL is disposed on a first electrode O_AE of the light detection element OPD. The photoelectric conversion layer O_RL includes an organic photo-sensing material, such as a light-sensitive semiconductor material.

A predetermined electric field is formed between the first electrode O_AE and a second electrode O_CE of the light detection element OPD. The photoelectric conversion layer O_RL generates an electrical signal that corresponds to the incident light. The photoelectric conversion layer O_RL generates charge by absorbing energy of the incident light.

The charge generated in the photoelectric conversion layer O_RL changes the electric field between the first electrode O_AE and the second electrode O_CE. The amount of charge generated in the photoelectric conversion layer O_RL changes according to whether the light is incident to the light detection element OPD and the amount and intensity of the light incident to the light detection element OPD. Accordingly, the electric field formed between the first electrode O_AE and the second electrode O_CE changes. The light detection element OPD according to an embodiment of the present disclosure obtains the user's fingerprint information through changes in the electric field between the first electrode O_AE and the second electrode O_CE.

However, embodiments are not necessarily limited thereto, and in some embodiments, the light detection element OPD includes a photo transistor that includes the photoelectric conversion layer O_RL as an active layer. For example, the light detection element OPD acquires the fingerprint information by detecting the amount of current flowing in the photo transistor. The light detection element OPD according to an embodiment of the present disclosure includes various photoelectric conversion elements that generate electric signals in response to changes in the amount of light, but embodiments of the present disclosure are not necessarily limited thereto.

The pixel defining layer PDL includes a black material. The pixel defining layer PDL further includes a black organic dye/pigment such as carbon black or aniline black. The pixel defining layer PDL is formed by mixing a blue organic material and a black organic material. The pixel defining layer PDL may further include a liquid-repellent organic material.

Pixel openings PX_OP and a sensor opening FX_OP are formed in the pixel defining layer PDL. The first electrodes R_AE, G_AE, and B_AE of the light emitting elements ED_R, ED_G, and ED_B are partially exposed by the pixel openings PX_OP. The first, second, and third light emitting areas LA-R, LA-G, and LA-B are defined as the portions of the first electrodes R_AE, G_AE, and B_AE exposed by the pixel openings PX_OP. The first electrode O_AE of the light detection element OPD is partially exposed by the sensor opening FX_OP. The portion of the first electrode O_AE exposed by the sensor opening FX_OP may be defined as a detection area SA.

A second electrode layer is commonly disposed on the first, second, and third light emitting layers R_EL, G_EL, and B_EL and the photoelectric conversion layer O_RL. The second electrode layer includes second electrodes R_CE, G_CE, and B_CE of the first, second, and third light emitting elements ED_R, ED_G, and ED_B and the second electrode O_CE of the light detection element OPD, The thin film encapsulation layer TFE is disposed on the display element layer DP-OLED. The input sensing unit ISP is directly disposed on the encapsulation layer TFE. The input sensing unit ISP includes the insulating layer IOL, the first insulating layer TC-IL1, the second insulating layer TC-IL2, the first detection part SP1, and the first light blocking parts BLP1. The insulating layer IOL is disposed on the thin film encapsulation layer TFE. In addition, the connection part CP illustrated in FIGS. 8 and 9 is disposed on the insulating layer IOL.

The first insulating layer TC-IL1 is disposed on the insulating layer IOL. The first detection part SP1 and the first light blocking part BLP1 are arranged on the first insulating layer TC-IL1. Although FIG. 11 shows the first detection part SP1 as being disposed on the first insulating layer TC-IL1, embodiments of the present disclosure are not necessarily limited thereto, and in some embodiments, the second detection part SP2 is disposed on the first insulating layer TC-IL1. The detection openings SOP formed in the first light blocking part BLP1 overlap the light detection element OPD.

In addition, light output from any one of the first, second, or third light emitting elements ED_R, ED_G, and ED_B can be reflected by the user's fingerprint. The reflected light passes through the detection opening SOP, is incident to the light detection elements OPD, and thus acquires fingerprint information. A method of acquiring fingerprint information will be described in detail with reference to FIGS. 18A and 18B.

Figure 12:
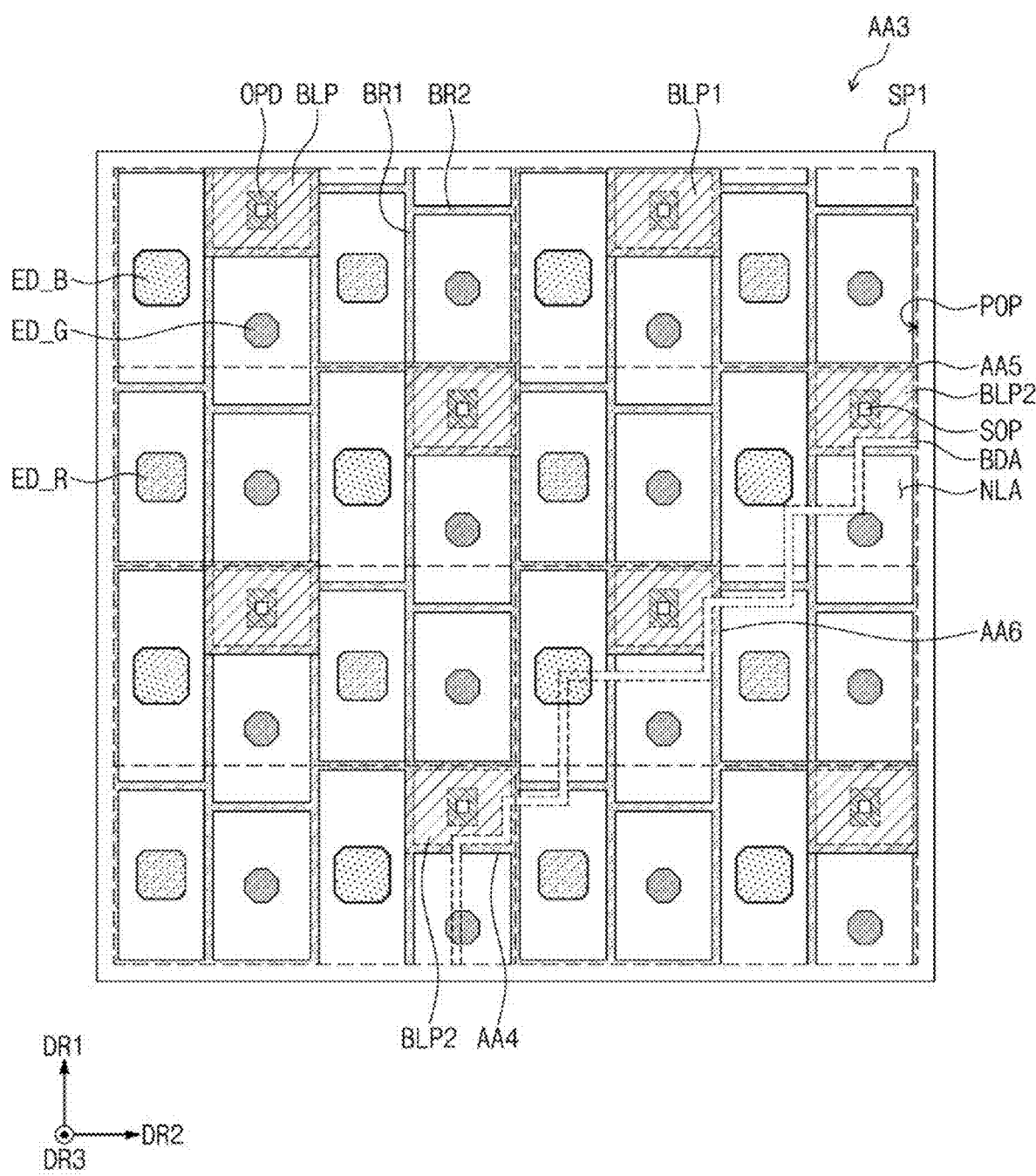
FIG. 12 is an enlarged plan view of a third area AA3 in in FIG. 8.

FIG. 12 is an enlarged plan view of a third area AA3 of FIG. 8.

Since the first and second branch portions BR1 and BR2, the first, second, and third light emitting elements ED_R, ED_G, and ED_B, and the light detection element OPD of FIG. 12 are the same as the first and second branch portions BR1 and BR2, the first, second, and third light emitting elements ED_R, ED_G, and ED_B, and the light detection element OPD of FIGS. 5, 8, and 10, a repeated description thereof will be omitted or simplified.

FIG. 12 illustrates second light blocking parts BLP2 arranged in an area adjacent to a boundary between the first detection part SP1 and the second detection part SP2, but embodiments of the present disclosure are not necessarily limited thereto, and the second light blocking parts BLP2 arranged in an area adjacent to a boundary between the first detection electrode SE1, the second detection electrode SE2, and the dummy part DUM of FIG. 8 also have substantially the same shape.

The boundary parts BDA are illustrated by dotted lines in FIG. 12.

Referring to FIGS. 8 and 12, in an embodiment, each of the first detection part SP1 and the second detection part SP2 includes the light blocking parts BLP. The light blocking parts BLP that is adjacent to the boundary parts BDA may be defined as the second light blocking parts BLP2. The second light blocking parts BLP2 have an area greater than that of the light detection elements OPD.

When viewed in a plan view, the first light blocking parts BLP1 are spaced apart from respective edges of the first and second detection parts SP1 and SP2. The second light blocking parts BLP2 are adjacent to the respective edges of the first detection parts SP1 and the second detection parts SP2. The edges of the first and second detection parts SP1 and SP2 are areas adjacent to the boundary parts BDA.

When viewed in a plan view, the detection openings SOP are formed at a center of the second light blocking parts BLP2. The detection openings SOP overlap the light detection elements OPD. When viewed in a plan view, each of the detection openings SOP overlaps a center of the corresponding light detection element OPD. When viewed in a plan view, the area of the detection openings SOP is less than the area of the light detection elements OPD.

The second light blocking parts BLP2 have shapes that correspond to the edges of the first and second detection parts SP1 and SP2. The second light blocking parts BLP2 have the same shapes as the respective edges of the first and second detection parts SP1 and SP2 that face each other. The second light blocking parts BLP2 have shapes that differ from those of the first light blocking parts BLP1. Areas of the second light blocking parts BLP2 are less than areas of the first light blocking parts BLP1. Of respective side surfaces of the second light blocking parts BLP2, those side surfaces that face a boundary have a stepped shape. Side surfaces of the second light blocking parts BLP2 are cut to have one stepped shape, but embodiments of the present disclosure are not necessarily limited thereto, and in some embodiments, the side surfaces are cut to have one or more stepped shapes or are cut without a stepped shape.

The stepped-shape side surfaces of the second light blocking parts BLP2 are cut to overlap one of the first detection part SP1 or the second detection part SP2. The second light blocking parts BLP2 extend from the first and second branch portions BR1 and BR2 of the first detection parts SP1 or the first and second branch portions BR1 and BR2 of the second detection parts SP2.

When the first detection electrode SE1, the second detection electrode SE2, and the dummy part DUM of FIG. 8 are insulated from each other, the input sensing unit ISP can normally detect an input. However, when the light blocking parts BLP are arranged in areas adjacent to the boundary part BDA between the first detection electrode SE1, the second detection electrode SE2, and the dummy part DUM of FIG. 8, the light blocking parts BLP overlap two different electrodes of the first detection electrode SE1, the second detection electrode SE2, and the dummy part DUM of FIG. 8, and the different electrodes may be electrically connected and shorted by the light blocking parts BLP. Accordingly, the input sensing unit ISP cannot normally detect an input.

However, the second light blocking parts BLP2 according to an embodiment of the present disclosure have shapes that correspond to the edges of the first and second detection parts SP1 and SP2. Side surfaces of the second light blocking parts BLP2 that are adjacent to the boundary parts BDA are cut. Accordingly, the second light blocking parts BLP2 overlap one of the first detection parts SP1, the second detection parts SP2, or the dummy parts DUM of FIG. 8. Thus, the first detection electrode SE1, the second detection electrode SE2, and the dummy part DUM of FIG. 8 are insulated from each other, and thus the input sensing unit ISP can normally detect an input.

FIGS. 13A to 13D illustrate second light blocking parts according to an embodiment of the present disclosure.

FIGS. 13A to 13D illustrate a case in which the boundary part BDA is adjacent to a lower portion of a right side of the second light blocking part BLP2. FIGS. 13A to 13D illustrate the light blocking parts BLP when viewed in a plan view.

Figure 13A:
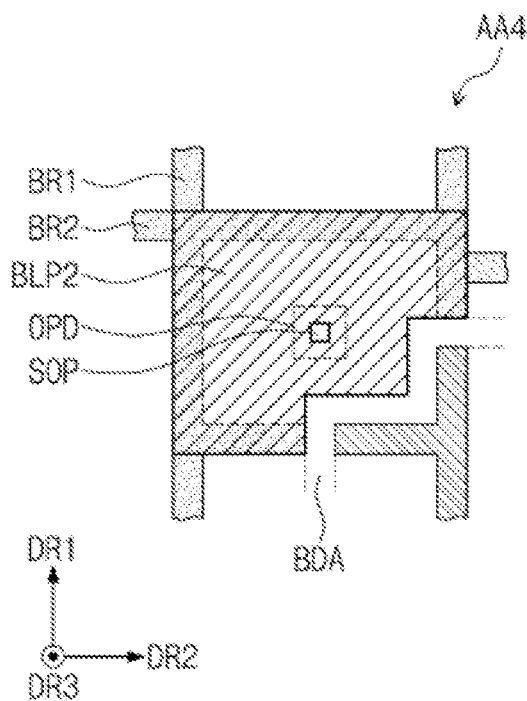
FIGS. 13A to 13D illustrate second light blocking parts according to an embodiment of the present disclosure.

Referring to FIG. 13A, in an embodiment, FIG. 13A is a plan view of a fourth area AA4 of FIG. 12. The side surfaces of the second light blocking parts BLP2 include two stepped shapes. The side surfaces that have the stepped shapes include two surfaces parallel to the first direction DR1 and two surfaces parallel to the second direction DR2.

Figure 13B:
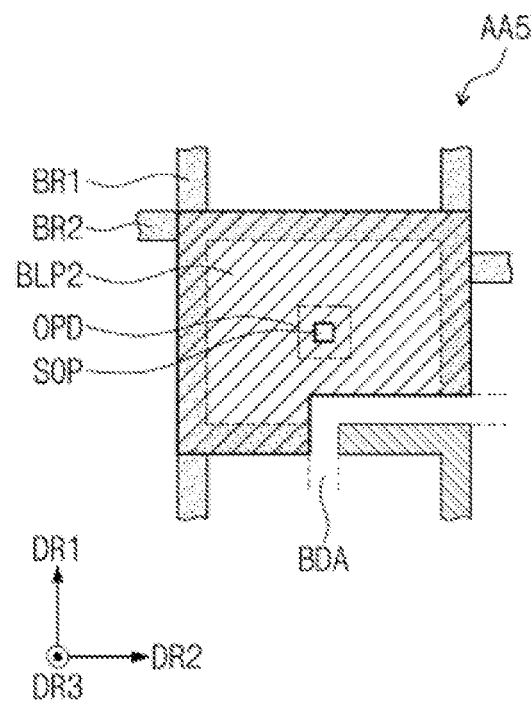

Referring to FIG. 13B, in an embodiment, FIG. 13B is a plan view of a fifth area AA5 of FIG. 12. The side surfaces of the second light blocking parts BLP2 include one stepped shape. The side surfaces that have the stepped shapes include one surface parallel to the first direction DR1 and one surface parallel to the second direction DR2. When viewed in a plan view, a length in the first direction DR1 of the surface parallel to the first direction DR1 is less than a length in the second direction DR2 of the surface parallel to the second direction DR2.

Figure 13C:
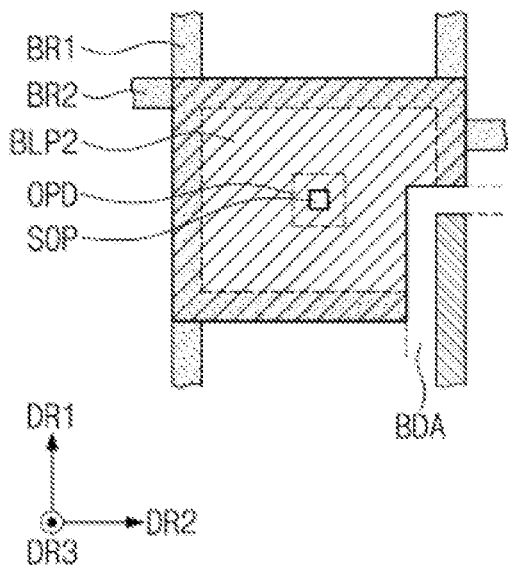

Referring to FIG. 13C, in an embodiment, FIG. 13C is a plan view of sixth area AA6 of FIG. 12. The side surfaces of the second light blocking parts BLP2 include one stepped shape. The side surfaces that have the stepped shapes include one surface parallel to the first direction DR1 and one surface parallel to the second direction DR2. When viewed in a plan view, a length in the second direction DR2 of the surface parallel to the second direction DR2 is less than a length in the first direction DR1 of the surface parallel to the first direction DR1.

Figure 13D:
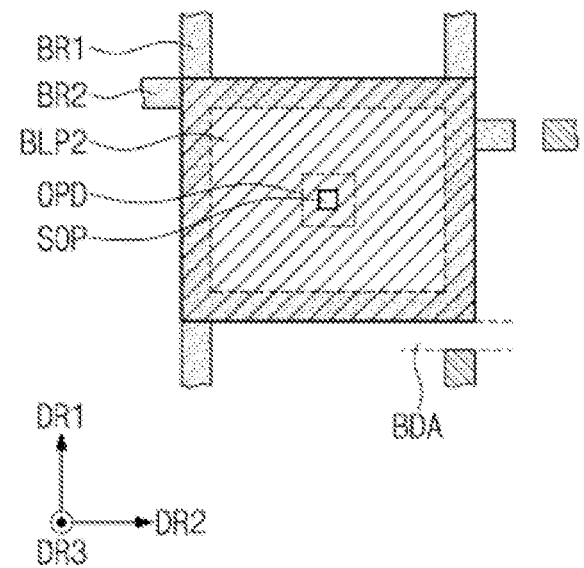

Referring to FIG. 13D, in an embodiment, the second light blocking parts BLP2 is not cut. When the second light blocking parts BLP2 extend form the first branch portions BR1 and the second branch portions BR2 of the first detection part SP1, the first branch portions BR1 or the second branch portions BR2 of the second detection part SP2 adjacent to the second light blocking parts BLP2 and the boundary part BDA are cut. Accordingly, a separation distance between the first detection part SP1 and the second detection part SP2 further increases.

Figure 14A:
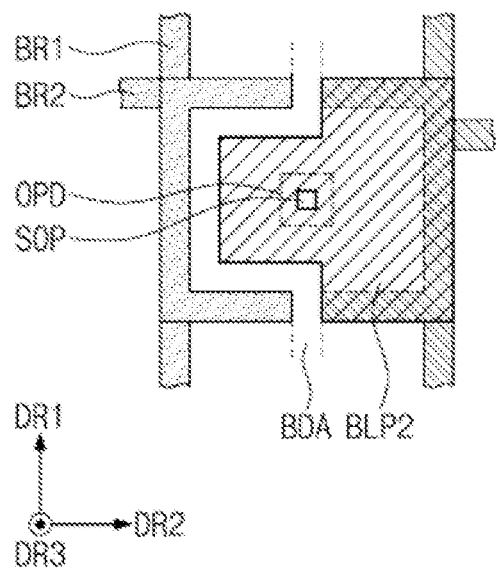
FIGS. 14A to 14C illustrate the second light blocking parts according to an embodiment of the present disclosure.
Figure 14B:
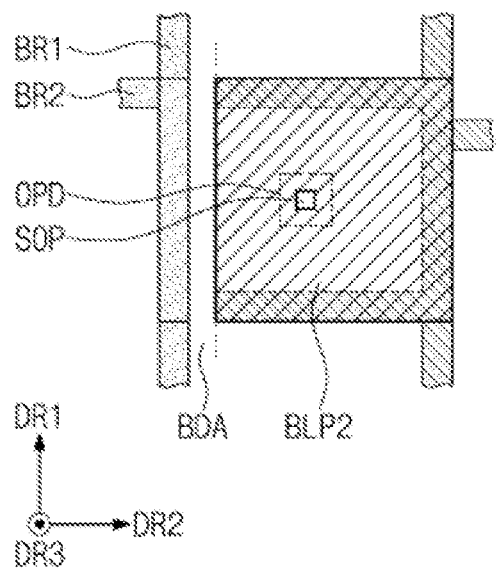
Figure 14C:
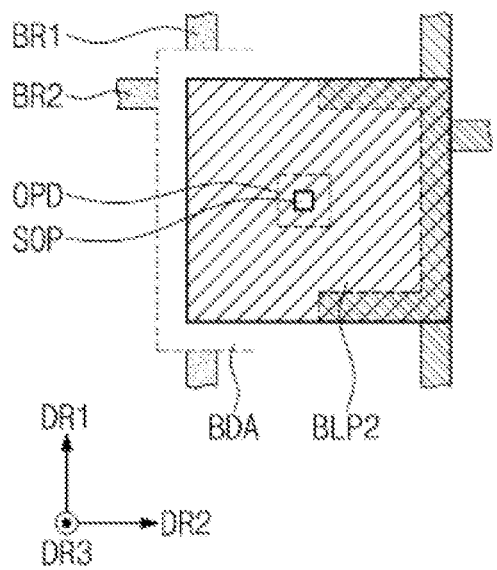
Figure 15A:
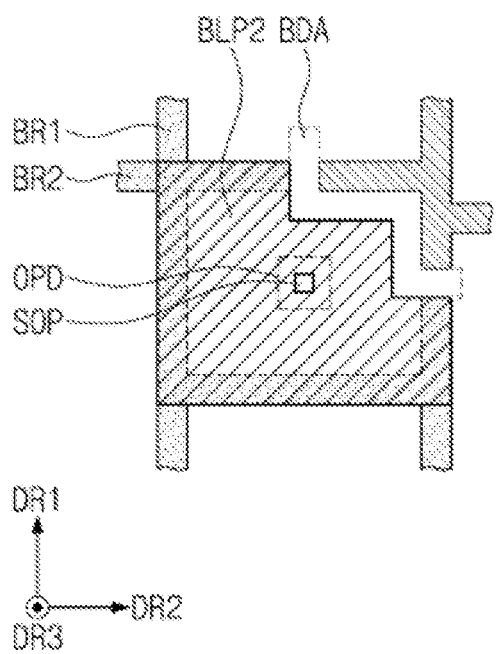
FIGS. 15A to 15D illustrate a light blocking part according to an embodiment of the present disclosure.
Figure 15B:
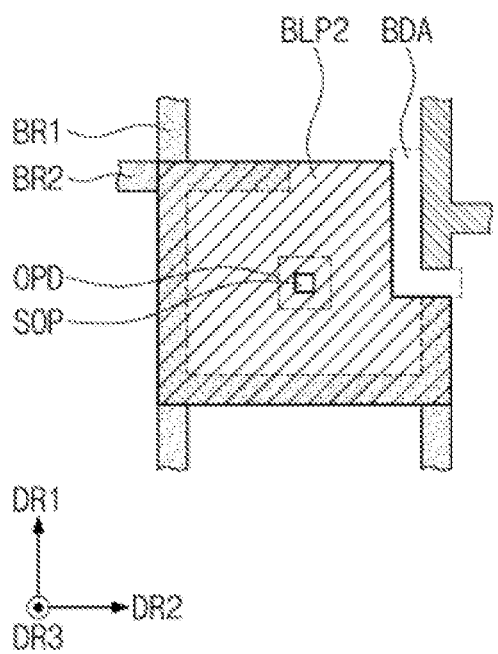
Figure 15C:
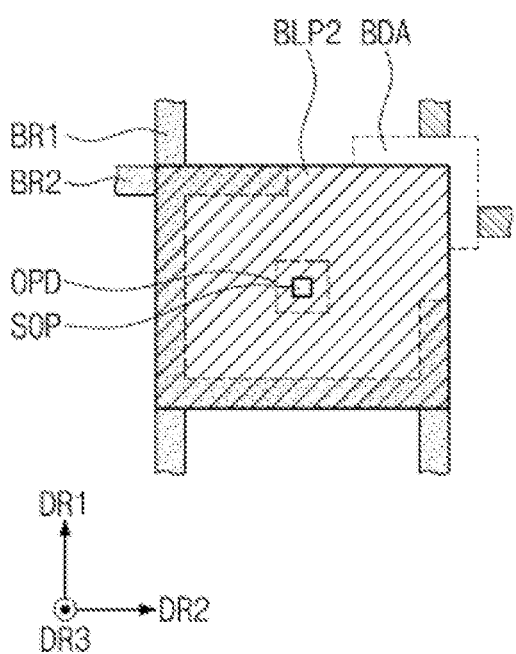
Figure 15D:
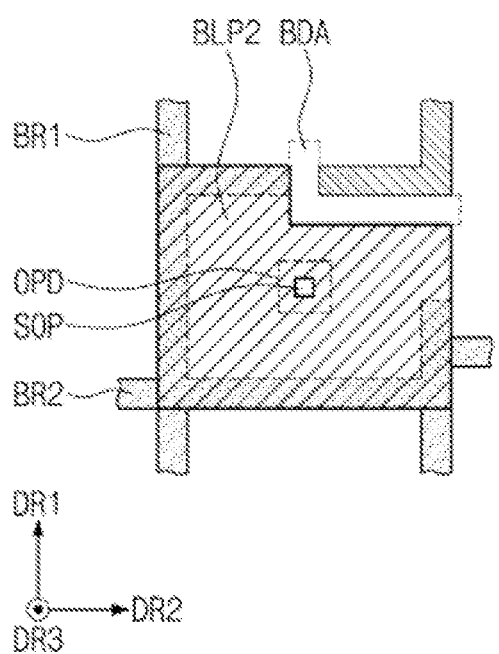
Figure 17A:
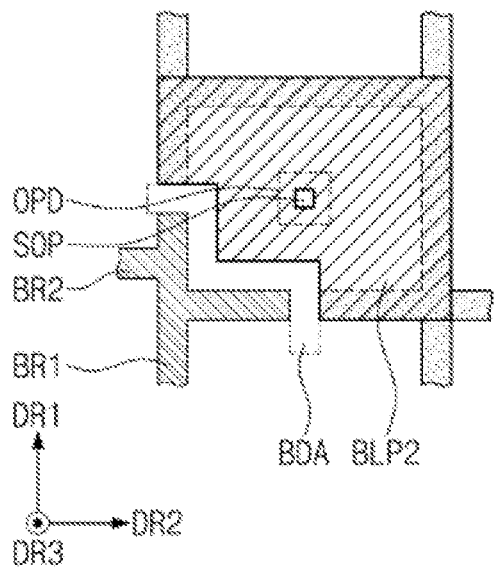
FIGS. 17A to 17D illustrate a light blocking part according to an embodiment of the present disclosure.
Figure 17B:
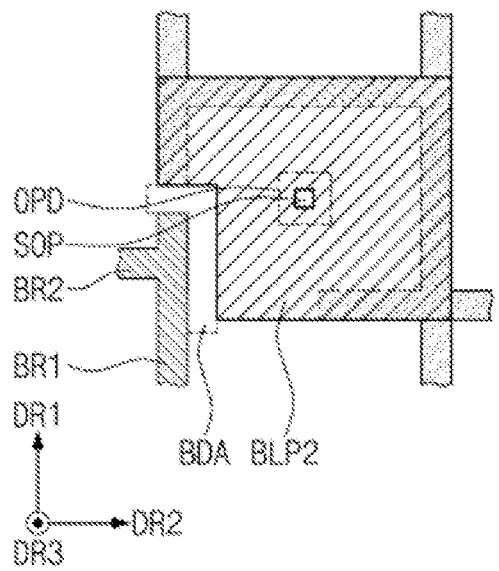
Figure 17C:
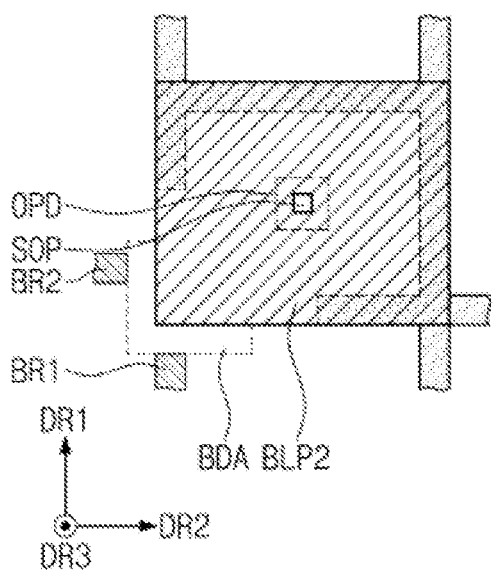
Figure 17D:
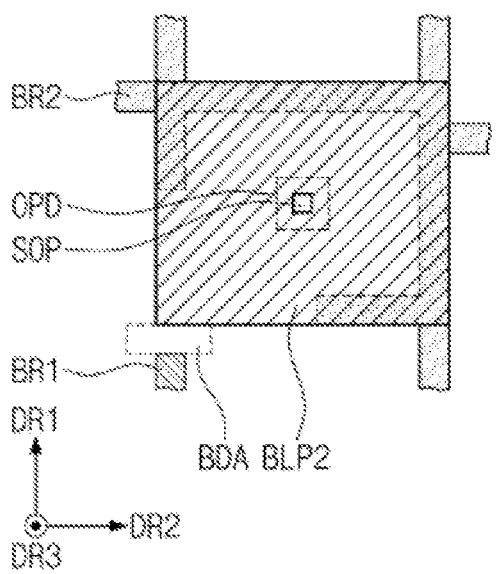

FIGS. 14A to 14C illustrate second light blocking parts according to an embodiment of the present disclosure.

FIGS. 14A and 14B illustrate a case in which the boundary part BDA is parallel to one of the first direction DR1 or the second direction DR2.

Referring to FIG. 14A, in an embodiment, when viewed in a plan view, the boundary part BDA extends parallel to the first direction DR1. One side surface of the second light blocking part BLP2 has two stepped shapes. The two stepped shapes are symmetrical to each other with respect to an axis parallel to the second direction DR2. The one side surface of the second light blocking part BLP2 includes surfaces parallel to the first direction DR1 and surfaces that extend from the surfaces parallel to the first direction DR1 and are parallel to the second direction DR2.

Referring to FIG. 14B, in an embodiment, the boundary part BDA extends in a direction parallel to the first direction DR1. The second light blocking part BLP2 is cut in a direction parallel to the first direction DR1. For example, the one side surface of the second light blocking part BLP2 does not have a stepped shape.

Referring to FIG. 14C, in an embodiment, the second light blocking parts BLP2 are not cut. When the second light blocking parts BLP2 extend from the first branch portions BR1 and the second branch portions BR2 of the second detection part SP2, the first branch portions BR1 or the second branch portions BR2 of the first detection part SP1 adjacent to the second light blocking parts BLP2 and the boundary part BDA are cut. Accordingly, the separation distance between the first detection part SP1 and the second detection part SP2 further increases.

FIGS. 15A to 15D illustrate a light blocking part according to an embodiment of the present disclosure. FIGS. 16A to 16D illustrate a light blocking part according to an embodiment of the present disclosure. FIGS. 17A to 17D illustrate a light blocking part according to an embodiment of the present disclosure.

FIGS. 15A to 17D are plan views of the second light blocking part BLP2.

FIGS. 15A to 15D illustrate a case in which the boundary part BDA is adjacent to an upper portion of a right side, FIGS. 16A to 16D illustrate a case in which the boundary part BDA is adjacent to an upper portion of a left side, and FIGS. 17A to 17D illustrate a case in which the boundary part BDA is adjacent to a lower portion of the left side.

The boundary part BDA and the second light blocking part BLP2 illustrated in FIGS. 15A to 17D are substantially the same as the boundary part BDA and the second light blocking part BLP2 illustrated in FIGS. 13A to 14C except that the directions are different, and thus a repeated description thereof will be omitted.

Figure 18A:
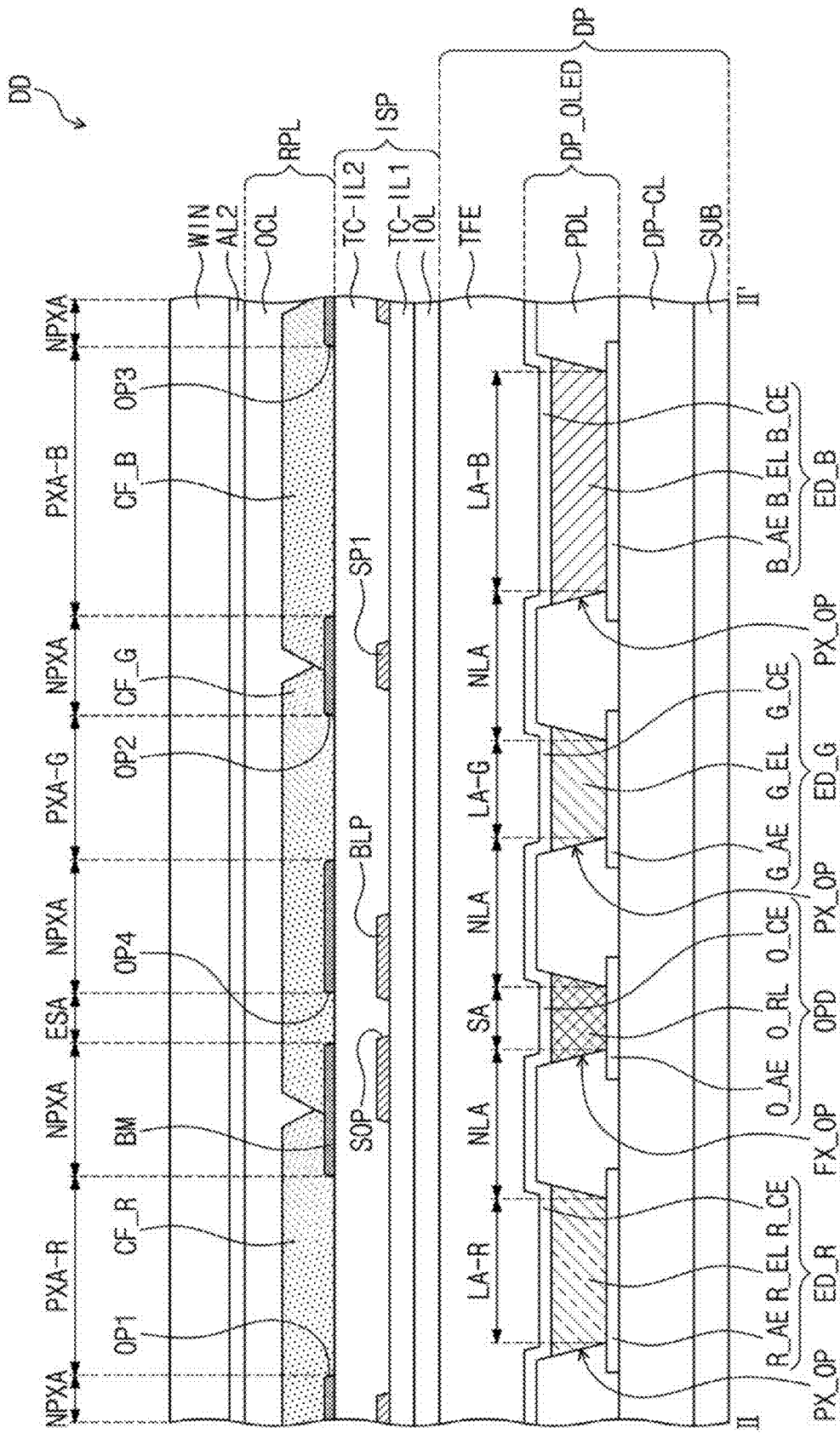
FIGS. 18A and 18B are cross-sectional views of a display device illustrated in FIG. 2.
Figure 18B:
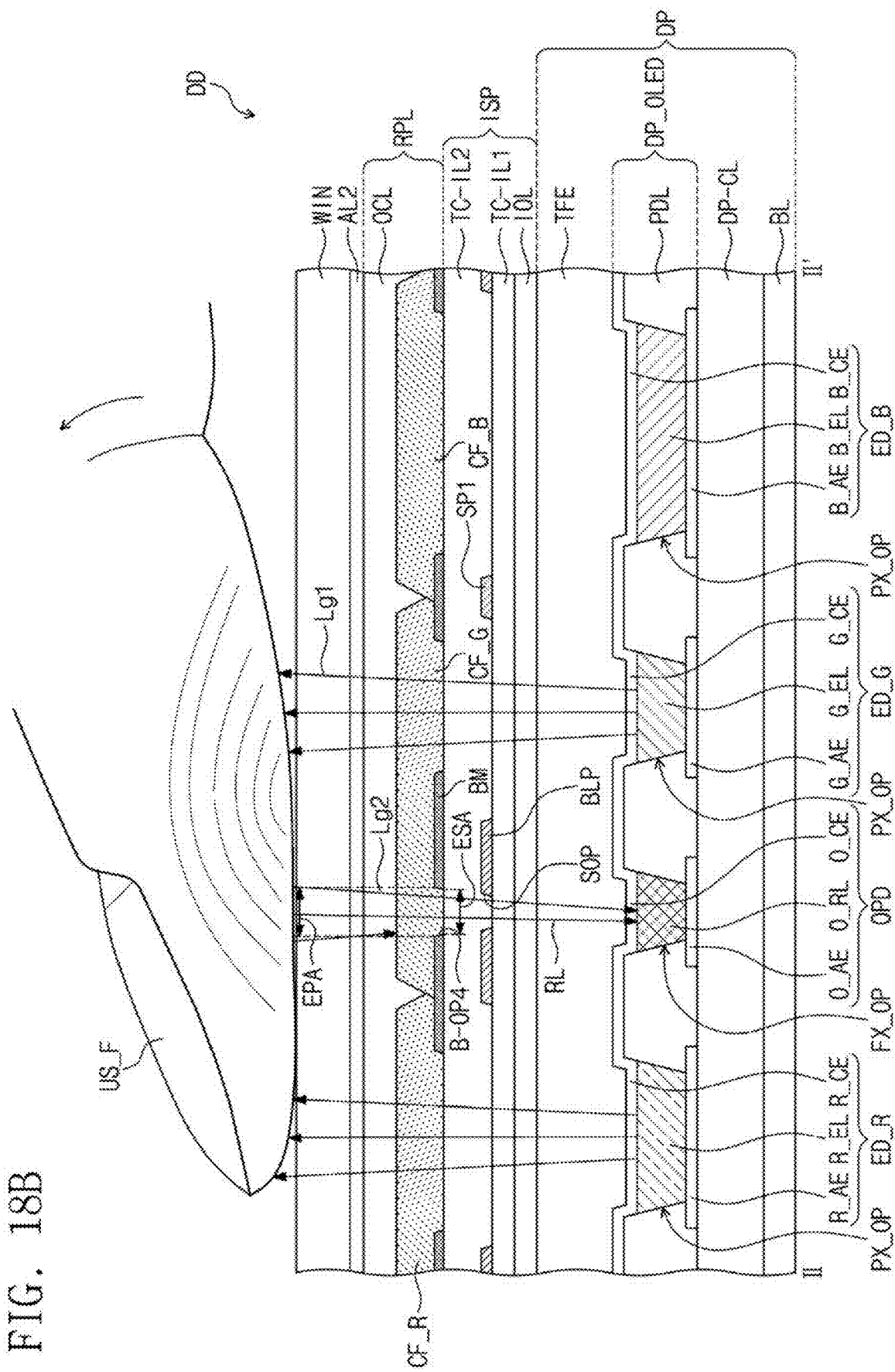

FIGS. 18A and 18B are cross-sectional views of a display device illustrated in FIG. 2.

For simplicity of illustration, the panel protection film PPF of FIG. 2 is omitted.

Since the display panel DP and the input sensing unit ISP of FIGS. 18A and 18B are the same as the display panel DP and the input sensing unit ISP of FIG. 11, a repeated description thereof will be omitted or simplified.

The circuit element layer DP-CL of FIGS. 18A and 18B is simply illustrated as a single layer. Similarly, the hole control layer HCL and the electron control layer ECL illustrated in FIG. 6 are omitted, and only the light emitting layers R_EL, B_EL, and G1_EL are illustrated.

FIGS. 18A and 18B illustrate a cross section of the display device DD that overlaps the first detection part SP1.

Referring to FIG. 18A, in an embodiment, the reflection prevention layer RPL is directly disposed on the second insulating layer TC-IL2. The reflection prevention layer RPL includes a plurality of light blocking patterns BM, an overcoating layer OCL, a first color filter CF_R, a second color filter CF_G, and a third color filter CF_B. The light blocking patterns BM are disposed on the second insulating layer TC-IL2. The light blocking patterns BM overlap the non-light emitting area NLA. The light blocking patterns BM may further include a black organic dye/pigment such as carbon black or aniline black.

First to fourth openings OP1, OP2, OP3, and OP4 are formed in the light blocking patterns BM. The first to fourth openings OP1, OP2, OP3, and OP4 overlap the pixel openings PX_OP and the sensor opening FX_OP. The first to third openings OP1, OP2, and OP3 overlap the corresponding pixel openings PX_OP. The fourth opening OP4 overlaps the sensor opening FX_OP.

The first to third openings OP1 to OP3 of the light blocking patterns BM define a first pixel area PXA-R, a second pixel area PXA-G, and a third pixel area PXA-B, respectively. Areas in which the light blocking patterns BM are arranged are defined as non-pixel areas NPXA. The light blocking patterns BM overlap the first detection part SP1 and the light blocking part BLP in the non-pixel areas NPXA.

A red light, a green light, and a blue light are emitted through the first pixel area PXA-R, the second pixel area PXA-G, and the third pixel area PXA-B, respectively. To increase output efficiency, each of the first pixel area PXA-R, the second pixel area PXA-G1, and the third pixel area PXA-B has an area greater than that of the corresponding pixel opening PX_OP of the pixel defining layer PDL.

The fourth opening OP4 of the light blocking pattern BM defines an effective detection area ESA. The effective detection area ESA has an area smaller than that of the detection area SA. The effective detection area ESA overlaps the detection opening SOP. A detailed description thereof will be provided below.

The first color filer CF_R, the second color filter CF_G, and the third color filter CF_B overlap a first light emitting area LA-R, a second light emitting area LA-G, and a third light emitting area LA-B, respectively. The first color filter CF_R, the second color filter CF_G, and the third color filter CF_B overlap the non-light emitting area NLA.

Any one of the first color filter CF_R, the second color filter CF_G, and the third color filter CF_B can overlap the detection area SA. For example, FIG. 18A shows that the second color filter CF_G overlaps the detection area SA. The second color filter CF_G overlaps the effective detection area ESA. The second color filter CF_G that overlaps the second light emitting area LA-G and the second color filter CF_G that overlaps the detection area SA have an integral shape, but embodiments of the present disclosure are not necessarily limited thereto.

The overcoating layer OCL is disposed on the first color filter CF_R, the second color filter CF_G, and the third color filter CF_B. The overcoating layer OCL has a thickness sufficient to remove steps between the first color filter CF_R, the second color filter CF_G, and the third color filter CF_B. The overcoating layer OCL flattens an upper surface of the reflection prevention layer RPL. The overcoating layer OCL may include an organic insulating material.

The window WIN is disposed on the reflection prevention layer RPL. The window WIN is bonded to the reflection prevention layer RPL by the second adhesive layer AL2.

Referring to FIG. 18B, in an embodiment, when the display device DD is operated, the first, second, and third light emitting elements ED_R, ED_G1, and ED_B output light. The first light emitting elements ED_R output red light in a red wavelength band, the second light emitting elements ED_G output green light in a green wavelength band, and the third light emitting elements ED_B output blue light in a blue wavelength band. The light detection element OPD receives a light beam that has a specific wavelength by a color filter disposed on the light detection element. In an embodiment, the light detection element OPD receives reflected green light Lg2. The reflected green light Lg2 is light obtained by reflecting an emitted green light Lg1 emitted from the second light emitting element ED_G by the user's fingerprint. Red light and blue light emitted from the first and third light emitting elements ED_R and ED_B may be also reflected by a user's hand US_F but are blocked by the second color filter CF_G.

An effective fingerprint area EPA that corresponds to one light detection element OPD is defined on an upper surface of the window WIN. The effective fingerprint area EPA is an area in which the emitted green light Lg1 is reflected into the reflected green light Lg2 by a user's finger in contact with the upper surface of the window WIN. The reflected green light Lg2 passes through the effective detection area ESA and reaches the light detection element OPD. The effective fingerprint area EPA overlaps the effective detection area ESA. The effective fingerprint area EPA overlaps the detection openings SOP.

The reflected green light beam Lg2 includes the fingerprint information, such as information on ridges or valleys between the ridges. The reflected green light beam Lg2 passes through the effective detection area ESA defined by the light blocking patterns BM and the detection openings SOP to provide the fingerprint information.

Figure 19A:
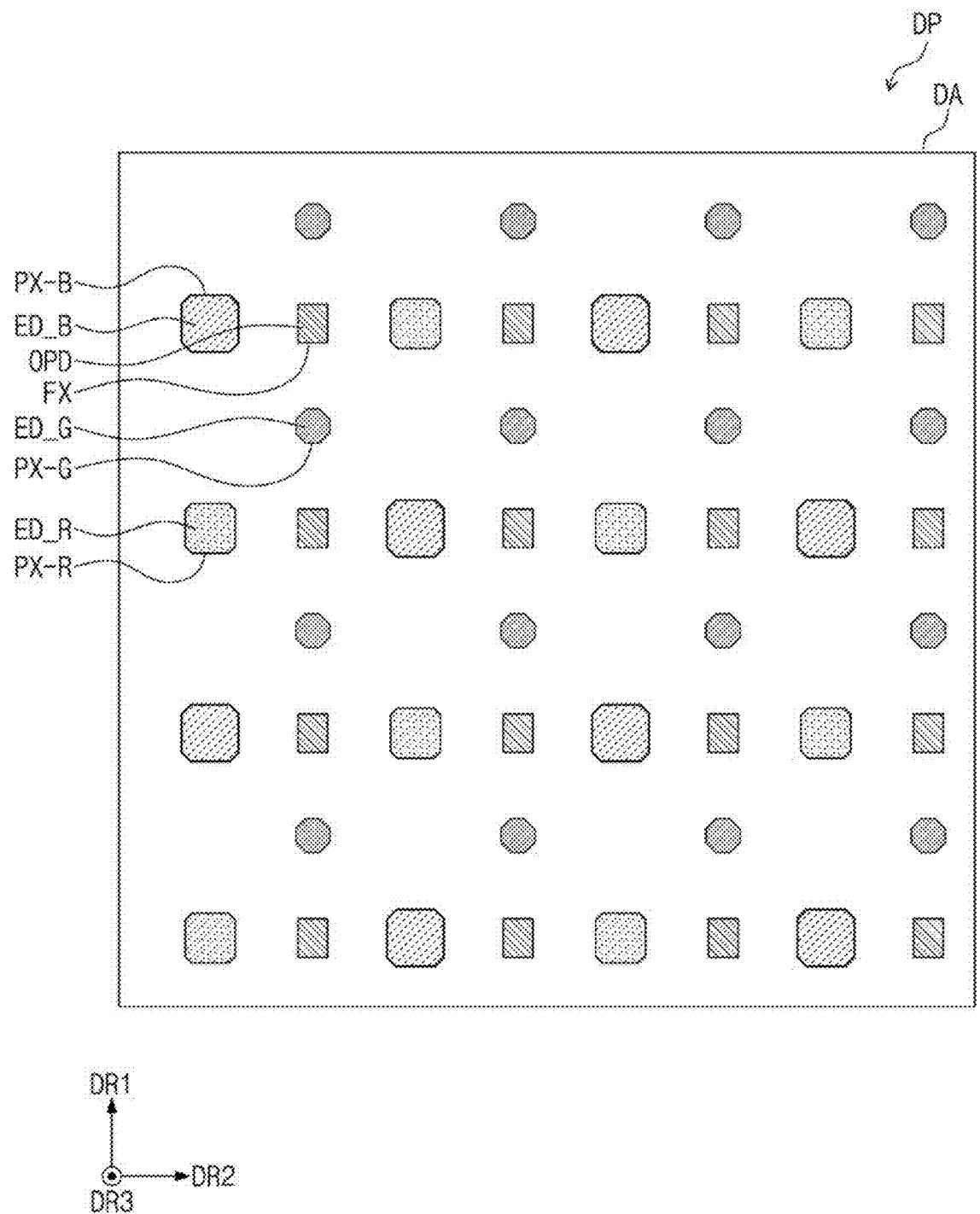
FIGS. 19A to 19C are plan views of a first detection part and a second detection part according to an embodiment of the present disclosure.
Figure 19B:
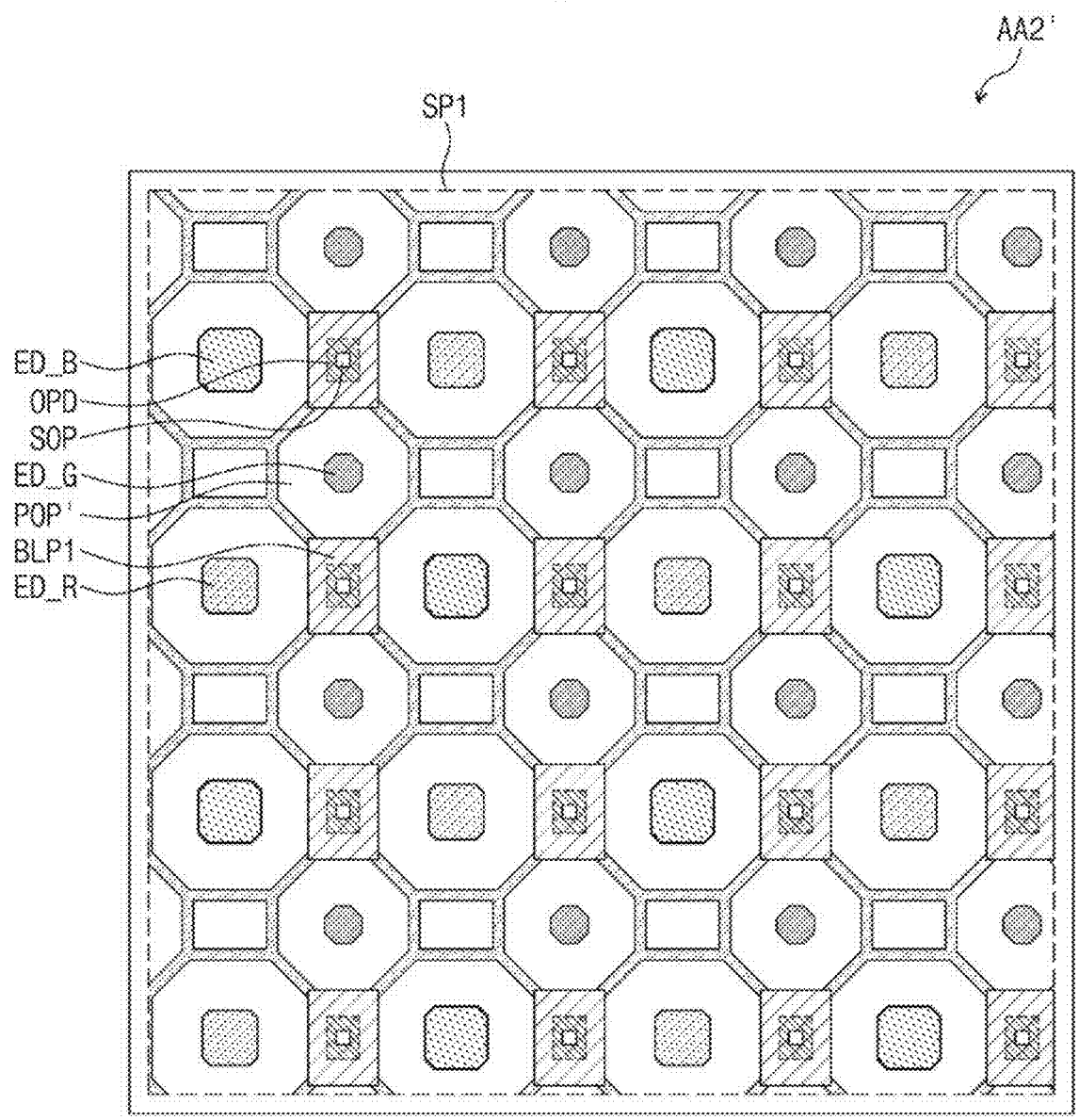
Figure 19C:
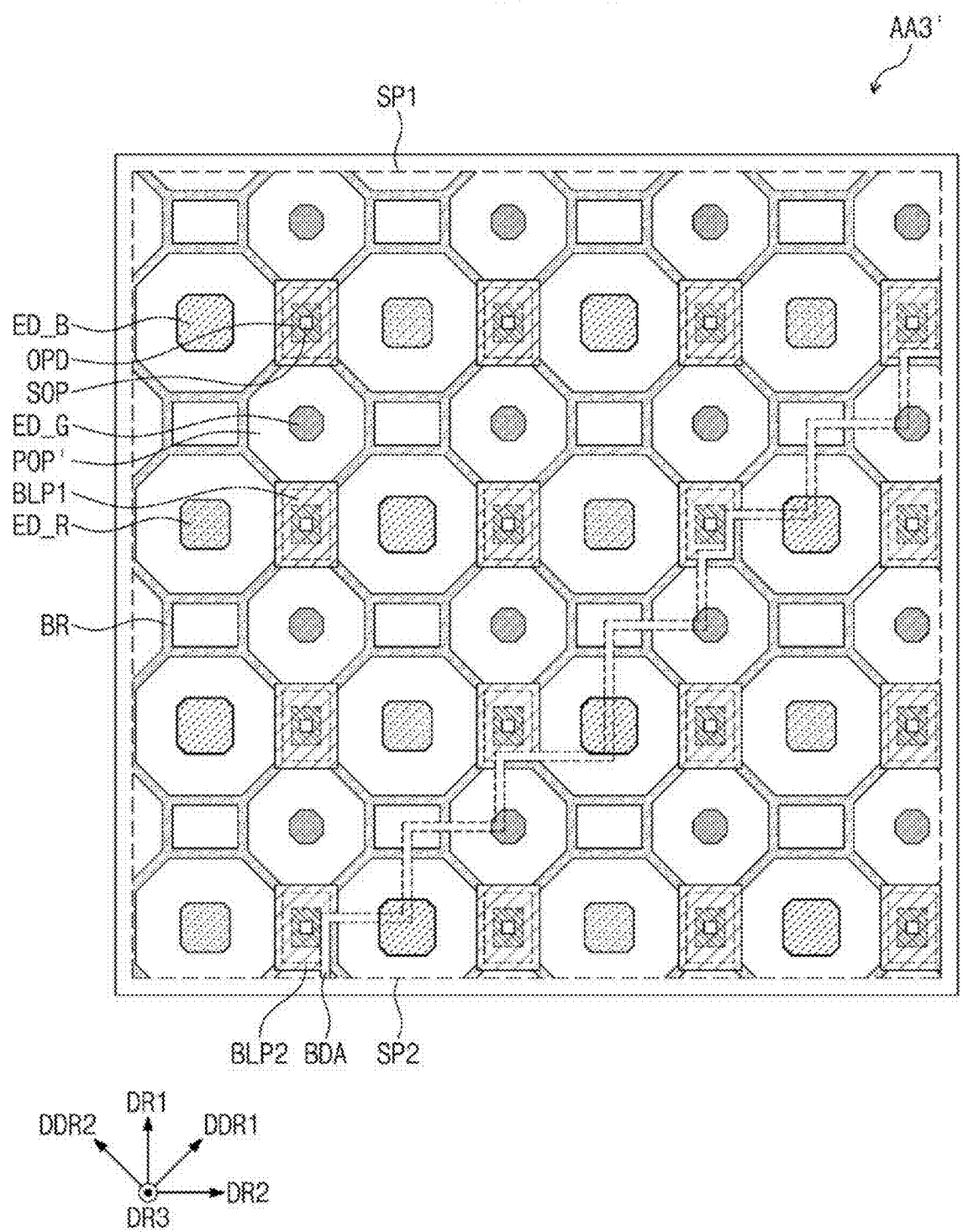

FIGS. 19A to 19C are plan views of a first detection part and a second detection part according to an embodiment of the present disclosure.

FIG. 19A is an enlarged plan view of a partial area of the display area DA of the display panel DP of FIG. 4. FIG. 19B is an enlarged plan view of the second area AA2' of FIG. 8, and FIG. 19C is an enlarged plan view of the third area AA3' of FIG. 8.

FIG. 19B is a plan view of the first detection part SP1.

FIG. 19B is a plan view of an area spaced apart from the boundary part BDA. FIG. 19C is a plan view of an area adjacent to the boundary part BDA.

The light detection element OPD, the first light emitting element ED_R, the second light emitting element ED_G, and the third light emitting element ED_B of FIGS. 19A to 19C are the same as the light detection element OPD, the first light emitting element ED_R, the second light emitting element ED_G, and the third light emitting element ED_B of FIG. 5, and thus a repeated description thereof will be omitted or simplified. Further, the pixel opening POP, the detection opening SOP, and the first and second light blocking parts BLP1 and BLP2 of FIGS. 19A to 19C are the same as the pixel opening POP, the detection opening SOP, and the first and second light blocking parts BLP1 and BLP2 of FIGS. 8 and 12, and thus a repeated description thereof will be omitted or simplified.

Referring to FIG. 19A, in an embodiment, the first light emitting elements ED_R and the third light emitting elements ED_B are alternately arranged in the first direction DR1. The first light emitting elements ED_R and the third light emitting elements ED_B are alternately arranged in the second direction DR2. The second light emitting elements ED_G and the light detection elements OPD are alternately arranged in the first direction DR1. The light detection elements OPD are arranged between the first light emitting elements ED_R and the third light emitting elements ED_B that are adjacent to each other in the second direction DR2. The second light emitting elements ED_G form a row that extends in the second direction DR2.

An area of the third light emitting element ED_B is greater than those of the first light emitting element ED_R and the second light emitting element ED_G. Further, an area of the second light emitting element ED_G is less than those of the first light emitting element ED_R and the third light emitting element ED_B. The first light emitting element ED_R is less than that of the third light emitting element ED_B and greater than that of the second light emitting element ED_G.

Referring to FIGS. 19B and 19C, in an embodiment, the first detection part SP1, the second detection part SP2, and the first and second light blocking parts BLP1 and BLP2 are arranged on the first light emitting element ED_R, the second light emitting element ED_G, and the third light emitting element ED_B.

The first detection part SP1 and the second detection part SP2 include branch portions BR that form a mesh shape. The branch portions BR are integrally formed. Pixel openings POP' are formed by the branch portions BR. The pixel openings POP' have an octagonal shape when viewed in a plan view, but embodiments of the present disclosure are not necessarily limited thereto, and in some embodiments, the pixel openings POP' have other shapes, based on the arrangement of the light emitting elements ED_R, ED_G, and ED_B and the light detection elements OPD.

When viewed in a plan view, the first light emitting elements ED_R, the second light emitting element ED_G, and the third light emitting elements ED_B are arranged in the pixel openings POP'. The first light emitting elements ED_R, the second light emitting elements ED_G, and the third light emitting elements ED_B are arranged in corresponding pixel opening POP'.

The first and second light blocking parts BLP1 and BLP2 extend from branch portions BR that are adjacent to the light detection elements OPD. The first and second light blocking parts BLP1 and BLP2 overlap the light detection elements OPD.

When viewed in a plan view, the detection openings SOP are formed at a center of the first light blocking parts BLP1. The detection openings SOP overlap the light detection elements OPD. When viewed in a plan view, each of the detection openings SOP overlaps a center of a corresponding light detection element OPD. When viewed in a plan view, the area of the detection openings SOP is less than the area of the light detection elements OPD.

The first light blocking parts BLP1 are spaced apart from the edges of the first and second detection parts SP1 and SP2. The first light blocking parts BLP1 are spaced apart from the boundary part BDA between the first and second detection parts SP1 and SP2. The second light blocking parts BLP2 overlap the respective edges of the first and second detection parts SP1 and SP2. The second light blocking parts BLP2 are adjacent to the boundary part BDA between the first and second detection parts SP1 and SP2.

When viewed in a plan view, the first light blocking parts BLP1 has a rectangular shape. When viewed in a plan view, the side surfaces of the second light blocking parts BLP2 have shapes that correspond to the edges of the adjacent first and second detection parts SP1 and SP2. The side surfaces of the second light blocking parts BLP2 that face the boundary part BDA have a stepped shape. When viewed in a plan view, the side surfaces of the second light blocking parts BLP2 that face the boundary part BDA have at least one stepped shape. Areas of the first light blocking parts BLP1 are greater than areas of the second light blocking parts BLP2.

According to an embodiment of the present disclosure, second light blocking parts have shapes that correspond to edges of first and second detection parts. Accordingly, the second light blocking parts can overlap any one of the first detection parts, the second detection parts, and the dummy parts. Thus, a first detection electrode, a second detection electrode, and a dummy part of FIG. 8 are insulated from each other, and an input sensing unit can normally detect an input.

Although embodiments have been described above, those skilled in the art may understand that embodiments of the present disclosure can be variously modified and changed without departing from the spirit and scope of the present disclosure described in the appended claims. Further, embodiments disclosed in the present disclosure are not intended to limit the technical spirit of the present disclosure, and all technical spirits within the appended claims and equivalents thereto are included in the scope of the present disclosure.

What is claimed is:

1. A display device, comprising:
a display panel that includes a plurality of light emitting elements and a plurality of light detection elements arranged between the light emitting elements; and
an input sensing unit disposed on the display panel,
wherein the input sensing unit includes:
a first detection electrode;
a second detection electrode that is insulated from and intersects the first detection electrode; and
a plurality of light blocking parts that include detection openings that overlap the light detection elements when viewed in a plan view,
wherein the light blocking parts include:
a plurality of first light blocking parts that are spaced apart from a boundary between the first detection electrode and the second detection electrode; and
a plurality of second light blocking parts that are closer to the boundary than the first light blocking parts, and
when viewed in a plan view, side surfaces of the second light blocking parts that face the boundary have shapes that correspond to edges of the first detection electrode and the second detection electrode adjacent to the second light blocking parts.

2. The display device of claim 1, wherein the second light blocking parts have different shapes from the first light blocking parts.

3. The display device of claim 1, wherein the first light blocking parts are spaced apart from the edges of the first detection electrode and the second detection electrode and overlap the first detection electrode and the second detection electrode, and
the second light blocking parts overlap the edges of the first detection electrode and the second detection electrode.

4. The display device of claim 1, wherein, when viewed in a plan view, each of the first light blocking parts has a area greater than each of the light detection elements.

5. The display device of claim 4, wherein, when viewed in a plan view, each of the second light blocking parts has a greater area than each of the light detection elements.

6. The display device of claim 5, wherein, when viewed in a plan view, each of the first light blocking parts has a greater area than each of the second light blocking parts.

7. The display device of claim 1, wherein, when viewed in a plan view, each of the detection openings overlaps a center of a corresponding light detection element among the light detection elements.

8. The display device of claim 1,
wherein the first detection electrode includes:
a pair of first detection parts arranged in a first direction; and
a connection part disposed between the first detection parts and that connects the first detection parts,
wherein the second detection electrode includes:
a pair of second detection parts arranged in a second direction that intersects the first direction; and
an extension pattern disposed between the second detection parts, wherein the extension pattern intersects the connection part and extends from the second detection parts, and
wherein the first detection parts, the second detection parts, and the extension pattern are arranged on the same layer, and the connection part is arranged on a different layer from the first detection parts, the second detection parts, and the extension pattern.

9. The display device of claim 8, wherein the light blocking parts are arranged on the same layer as that of the first detection parts, the second detection parts, and the extension pattern.

10. The display device of claim 8, wherein the light blocking parts extend from the first detection parts and the second detection parts.

11. The display device of claim 8, wherein each of the first detection parts and the second detection parts includes:
a plurality of first branch portions that extend in the first direction; and
a plurality of second branch portions that intersect the first branch portions in the second direction and are integrally formed with the first branch portions, and
when viewed in a plan view, the first branch portions and the second branch portions extend between the light emitting elements and the light detection elements and between the light emitting elements.

12. The display device of claim 11, wherein the light blocking parts extend from the first branch portions and the second branch portions adjacent to the light detection elements.

13. The display device of claim 12, wherein the light blocking parts extend from the first branch portions and the second branch portions of the first detection parts or the first branch portions and from the second branch portions of the second detection parts.

14. The display device of claim 1, wherein side surfaces of each of the second light blocking parts that face the boundary have stepped shapes.

15. The display device of claim 14, wherein the side surfaces of each of the second light blocking parts have at least two stepped shapes.

16. The display device of claim 14, wherein the side surfaces of each of the second light blocking parts have at least one stepped shape.

17. The display device of claim 1, wherein each of the second light blocking parts has a same shape and a same area as each of the first light blocking parts.

18. The display device of claim 1, further comprising:
a light blocking pattern disposed on the input sensing unit and that overlaps between the light emitting elements and between the light emitting elements and the light detection elements.

19. A display device, comprising:
a display panel that includes a plurality of light emitting elements and a plurality of light detection elements arranged between the light emitting elements; and
an input sensing unit disposed on the display panel,
wherein the input sensing unit includes:
a plurality of first detection parts arranged in a first direction;
a plurality of second detection parts that are insulated from and intersect the first detection parts; and
a plurality of light blocking parts that include detection openings and that overlap the light detection elements when viewed in a plan view, and
wherein the light blocking parts adjacent to a boundary between the first detection parts and the second detection parts have a stepped shape.

20. The display device of claim 19, wherein the light blocking parts include:
a plurality of first light blocking parts spaced apart from the boundary between the first detection parts and the second detection parts; and
a plurality of second light blocking parts that are closer to the boundary than the first light blocking parts,
wherein each of the first light blocking parts has a greater area than each of the second light blocking parts.

* * * * *